(12) United States Patent
Dura

(10) Patent No.: US 7,652,612 B2
(45) Date of Patent: Jan. 26, 2010

(54) CYCLIC PIPELINE ANALOG-TO-DIGITAL CONVERTER

(75) Inventor: Renaud Dura, Aix en Provence (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/075,226

(22) Filed: Mar. 10, 2008

(65) Prior Publication Data

US 2009/0224951 A1 Sep. 10, 2009

(51) Int. Cl.
*H03M 1/34* (2006.01)
(52) U.S. Cl. .................................. 341/163; 341/161
(58) Field of Classification Search .............. 341/155, 341/163, 172, 144, 161
See application file for complete search history.

(56) References Cited

U.S. PATENT DOCUMENTS

| 5,861,828 | A | 1/1999 | Opris |
| 6,097,326 | A | 8/2000 | Opris et al. |
| 6,285,309 | B1 | 9/2001 | Yu |
| 6,366,230 | B1 | 4/2002 | Zhang |
| 6,441,769 | B1 | 8/2002 | Nagaraj |
| 6,501,400 | B2 | 12/2002 | Ali |
| 6,535,157 | B1 | 3/2003 | Garrity et al. |
| 6,784,824 | B1 | 8/2004 | Quinn |
| 6,864,820 | B2 | 3/2005 | Nakamura |
| 7,015,852 | B1 | 3/2006 | Atris et al. |
| 7,026,968 | B1 * | 4/2006 | Ali ............................ 341/120 |
| 7,088,275 | B2 * | 8/2006 | Waltari ....................... 341/155 |
| 7,151,475 | B2 * | 12/2006 | Boemler ..................... 341/155 |
| 7,259,708 | B2 | 8/2007 | Lu |
| 7,397,287 | B2 * | 7/2008 | Makihara ..................... 327/91 |
| 2005/0038846 | A1 * | 2/2005 | Devendorf et al. .......... 708/801 |

* cited by examiner

*Primary Examiner*—Peguy JeanPierre
(74) *Attorney, Agent, or Firm*—Schwegman, Lundberg & Woessner, P.A.

(57) ABSTRACT

Some embodiments include apparatus and methods having a first module with a capacitor network configured to receive a sample of an analog input signal and an amplifier configured to couple to the capacitor network in a plurality of arrangements to successively generate a plurality of residue signals at an amplifier output node of the amplifier without resetting the amplifier between generation of least two of the plurality of residue signals, and a second module configured to generate a digital signal based on a plurality of intermediate codes generated from the sample signal and the plurality of residue signals, the digital signal including a digital value of the sample.

14 Claims, 16 Drawing Sheets

| TIME INTERVAL | Vresidue$_i$ | K$_i$ VALUE | NUMBER OF Bits OF K$_i$ |
|---|---|---|---|
| | V$_{IN}$ = VsampleA | | |
| T0 | Vresidue$_0$ | K$_0$ | M bits |
| T1 | Vresidue$_1$ | K$_1$ | M bits |
| T2 | Vresidue$_2$ | K$_2$ | M bits |
| ... | ... | ... | ... |
| T(N−2) | Vresidue$_{N-2}$ | K$_{N-2}$ | M bits |
| D$_{OUT}$ (VsampleA) = COMBINATION OF K$_0$, K$_1$, K$_2$, ..., K$_{N-2}$ | | | |

| TIME INTERVAL / ACTIVITIES | ARRANGEMENT | $K_i$ |
|---|---|---|
| T0 RESET | 900: $V_{IN}$ (VsampleA) — C2, C1 — 620 op-amp — Vresidue$_0$=0 — C4, C3; 623 | $K_0$ |
| T1 AMPLIFICATION 1 | 901: 923 feedback; 612 Vref$_{12}$ — C2 — 621 — C1 — 620 op-amp — Vresidue$_1$ — C4, C3; 912, 622, 623 | $K_1$ |
| T2 AMPLIFICATION 2 | 902: 923; 634 Vref$_{34}$ — C4 — 621 — C3 — 620 — Vresidue$_2$ — C2, C1; 934, 622, 623 | $K_2$ |
| T3 AMPLIFICATION 3 | 903: 923; 612 Vref$_{12}$ — C1 — 621 — C2 — 620 — Vresidue$_3$ — C4, C3; 912, 622, 623 | $K_3$ |
| T4 AMPLIFICATION 4 | 904: 923; 634 Vref$_{34}$ — C3 — 621 — C4 — 620 — Vresidue$_4$ — C2, C1; 934, 622, 623 | $K_4$ |
| T5 AMPLIFICATION 5 | REPEAT ARRANGEMENT 901 FOR Vresidue$_5$ (AMPLIFICATION 5 = AMPLIFICATION 1) | $K_5$ |
| T6 AMPLIFICATION 6 | REPEAT ARRANGEMENT 902 FOR Vresidue$_6$ (AMPLIFICATION 6 = AMPLIFICATION 2) | $K_6$ |
| T7 AMPLIFICATION 7 | REPEAT ARRANGEMENT 903 FOR Vresidue$_7$ (AMPLIFICATION 7 = AMPLIFICATION 3) | $K_7$ |
| T8 AMPLIFICATION 8 | REPEAT ARRANGEMENT 904 FOR Vresidue$_8$ (Vresidue$_{N-2}$) (AMPLIFICATION 8 = AMPLIFICATION 4) | $K_8$ ($K_{N-2}$) |

| TIME INTERVAL / ACTIVITIES | ARRANGEMENT | $K_i$ |
|---|---|---|
| T9 RESET | 1000: $V_{IN}$ ($V_{sampleB}$) connected to C4, C3 at op-amp 620, output $V_{residue_0} = 0$, with C2, C1 at node 623 | $K_0$ |
| T10 AMPLIFICATION 1 | 1001: $V_{ref_{34}}$ via 634, C4 to node 621, C3 feedback (923), op-amp 620, 622, output $V_{residue_1}$, C2, C1 at 623; switch 934 | $K_1$ |
| T11 AMPLIFICATION 2 | 1002: $V_{ref_{12}}$ via 612, C2 to node 621, C1 feedback (923), op-amp 620, 622, output $V_{residue_2}$, C4, C3 at 623; switch 912 | $K_2$ |
| T12 AMPLIFICATION 3 | 1003: $V_{ref_{34}}$ via 634, C3 to node 621, C4 feedback (923), op-amp 620, 622, output $V_{residue_3}$, C2, C1 at 623; switch 934 | $K_3$ |
| T13 AMPLIFICATION 4 | 1004: $V_{ref_{12}}$ via 612, C1 to node 621, C2 feedback (923), op-amp 620, 622, output $V_{residue_4}$, C2, C1 at 623; switch 912 | $K_4$ |
| T14 AMPLIFICATION 5 | REPEAT ARRANGEMENT 1001 FOR $V_{residue_5}$ (AMPLIFICATION 5 = AMPLIFICATION 1) | $K_5$ |
| T15 AMPLIFICATION 6 | REPEAT ARRANGEMENT 1002 FOR $V_{residue_6}$ (AMPLIFICATION 6 = AMPLIFICATION 2) | $K_6$ |
| T16 AMPLIFICATION 7 | REPEAT ARRANGEMENT 1003 FOR $V_{residue_7}$ (AMPLIFICATION 7 = AMPLIFICATION 3) | $K_7$ |
| T17 AMPLIFICATION 8 | REPEAT ARRANGEMENT 1004 FOR $V_{residue_8}$ ($V_{residue_{N-2}}$) (AMPLIFICATION 8 = AMPLIFICATION 4) | $K_8$ ($K_{N-2}$) |

CYCLIC PIPELINE ANALOG-TO-DIGITAL CONVERTER

BACKGROUND

Analog-to-digital converters (ADCs) are circuitry in many electronic devices such as audio and video players, digital cameras, cellular phones, televisions, and the like. An ADC converts analog signals into digital signals. Some device may receive information such as sound and light and use an analog signal to present the information. The analog signal usually has a continuous curve shape. The device may use an ADC to convert the analog signal, which presents the received information, into a digital signal for further processing. The digital signal usually has a square-like shape representing digital values such as binary value zeros and ones (digits "0" and "1"). Some devices may choose to process digital signals instead of analog signals for various reasons such as device performance.

Many different types of ADCs are available. Depending on the application of a device, one type of ADC may suit a device better than the other types. Selecting which type of ADCs to use in a device may involve consideration of the characteristics of the ADC, such as size, speed, accuracy, and power consumption.

BRIEF DESCRIPTION OF THE DRAWINGS

FIG. 9 is an example chart showing various arrangements of the converting unit of the ADC of FIG. 6 and FIG. 7 during a conversion of a sample.

FIG. 10 is an example chart showing various arrangements of the converting unit of the ADC of FIG. 6 and FIG. 7 during a conversion of another sample.

DETAILED DESCRIPTION

Figure 1:
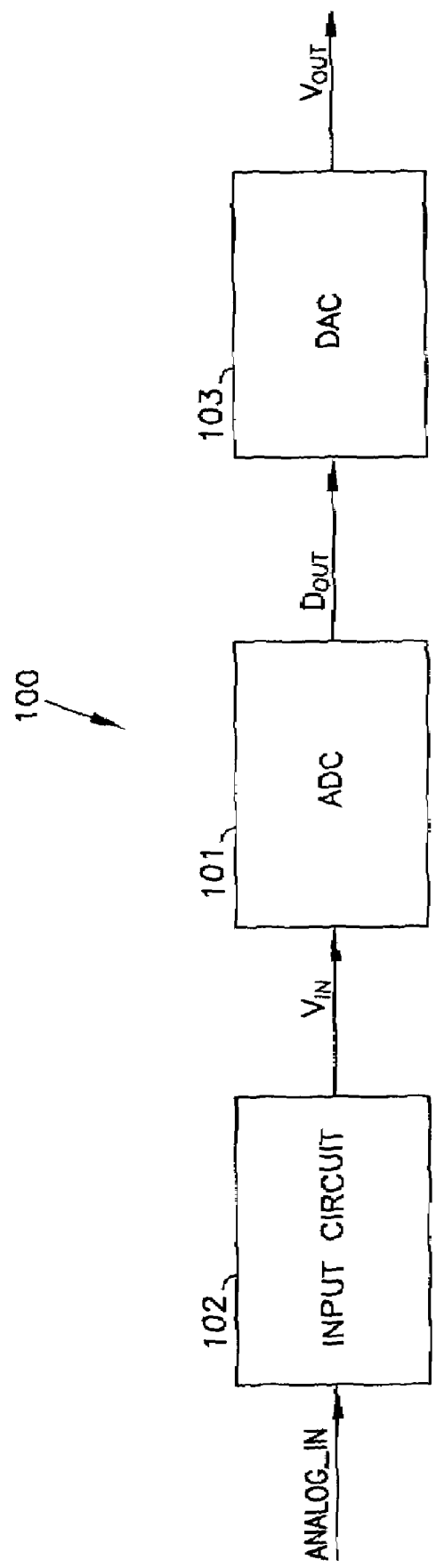
FIG. 1 shows an apparatus, including an ADC, according to an embodiment of the invention.

FIG. 1 shows an apparatus 100 including an ADC 101 according to an embodiment of the invention. Apparatus 100 may include, or be included in, an electronic product such as an audio player, video player, digital camera, cellular phone, or television, and the like. As shown in FIG. 1, apparatus 100 may include an input circuit 102 to receive information ANALOG_IN and provide an analog input signal $V_{IN}$ that may represent a value of the information ANALOG_IN. ADC 101 may receive the $V_{IN}$ signal and convert it into a digital signal $D_{OUT}$. Apparatus 100 may also include a digital-to-analog converter (DAC) 103 to convert the $D_{OUT}$ signal into an analog signal $V_{OUT}$.

Information ANALOG_IN may include information from an analog source such as sound, light, or the like. Each of the $V_{IN}$ and $V_{OUT}$ signals may have a continuous curve shape (e.g., a sine wave, corresponding to the value of the information ANALOG_IN). The $D_{OUT}$ signal may include a value representing a number of bits such as binary zeros and ones (logic zeros and ones). ADC 101 may include an embodiment of an ADC described below with reference to FIG. 2 through FIG. 17.

Figure 2:
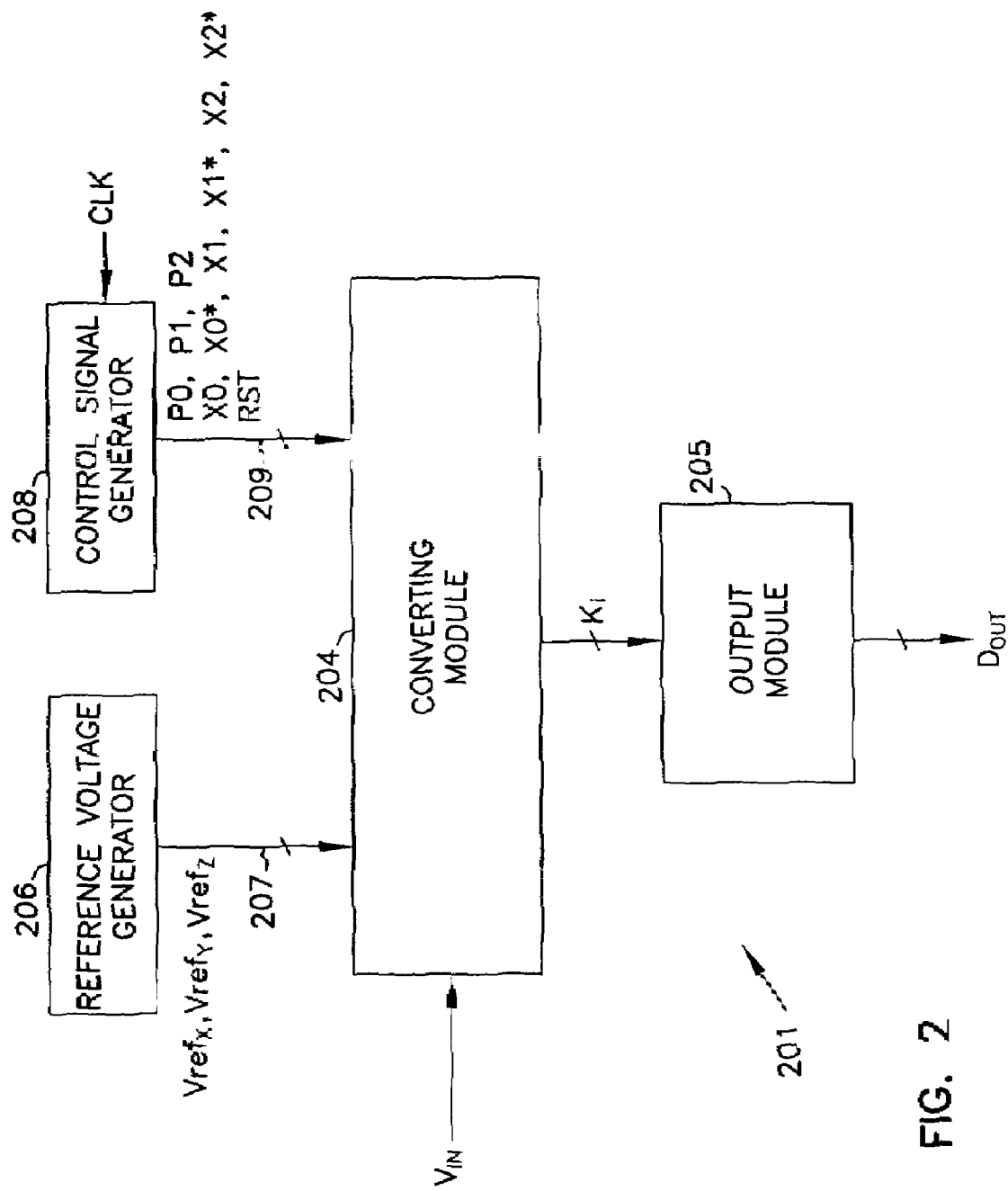
FIG. 2 shows an ADC according to an embodiment of the invention.

FIG. 2 shows an ADC 201 according to an embodiment of the invention. ADC 201 may correspond to ADC 101 of FIG. 1. As shown in FIG. 2, ADC 201 may include a converting module 204 to receive analog input signal $V_{IN}$ and generate a number of intermediate codes $K_i$ based on the analog value of the $V_{IN}$ signal. The intermediate codes $K_i$ include binary bits. ADC 201 may also include an output module 205 to receive the intermediate codes $K_i$ and generate a digital signal $D_{OUT}$, which represents a digital value of the $V_{IN}$ signal. ADC 201 may also include a reference voltage generator 206 to provide a number of reference voltage signals $Vref_X$, $Vref_Y$, and $Vref_Z$ on lines (or bus) 207. The $Vref_X$, $Vref_Y$, and $Vref_Z$ signals may have different voltage values. ADC 201 may further include a control signal generator 208 to receive a signal CLK and provide a number of control signals P0, P1, P2, X0, X0*, X1, X1*, X2, X2*, and RST on lines (or bus) 209. Each of these control signals may include different phases having signal levels (e.g., low and high signal levels) corresponding to logic zero and one ("0" and "1") values. The CLK signal may correspond to a clock signal provided to or generated by ADC 201. ADC 201 may use the signals on lines 207 and lines 209 during a conversion of the $V_{IN}$ signal into the $D_{OUT}$ signal. ADC 201 may include an embodiment of an ADC described below with reference to FIG. 3 through FIG. 17.

Figure 3:
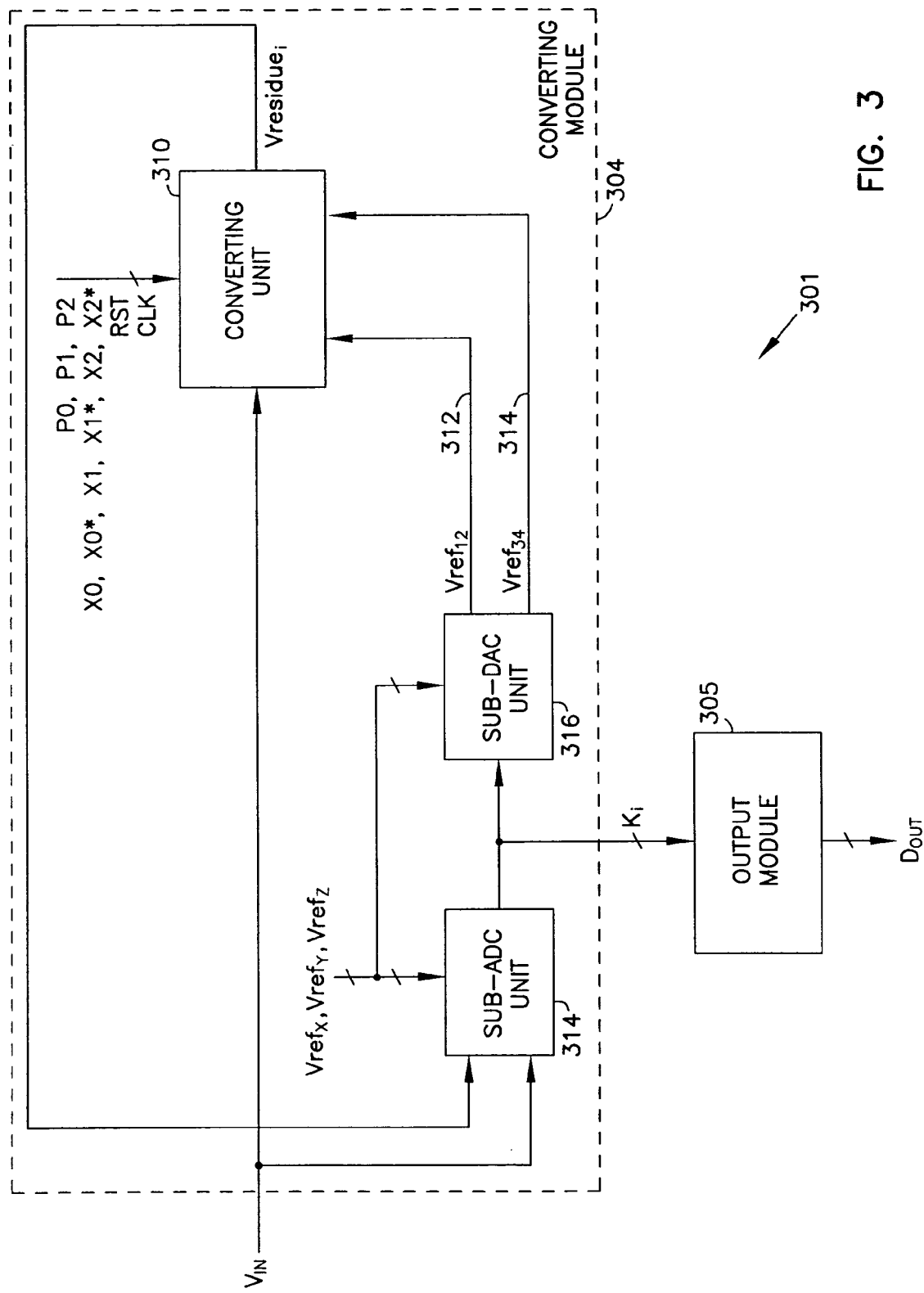
FIG. 3 shows an ADC having a converting module according to an embodiment of the invention.

FIG. 3 shows an ADC 301 having a converting module 304 according to an embodiment of the invention. ADC 301 may correspond to ADC 101 of FIG. 1 or ADC 201 of FIG. 2. As shown in FIG. 3, converting unit 310 may receive analog input signal $V_{IN}$ and generate intermediate code $K_i$. ADC 301 also may include an output module 305 to receive the intermediate code $K_i$ and generate a digital signal $D_{OUT}$ representing a digital value of the $V_{IN}$ signal. The $Vref_X$, $Vref_Y$, $Vref_Z$, P0, P1, P2, X0, X0*, X1, X1*, X2, X2*, and RST signals may correspond to those of ADC 201 of FIG. 2. The following description refers to FIG. 3 and FIG. 4.

Figures 4, 5:
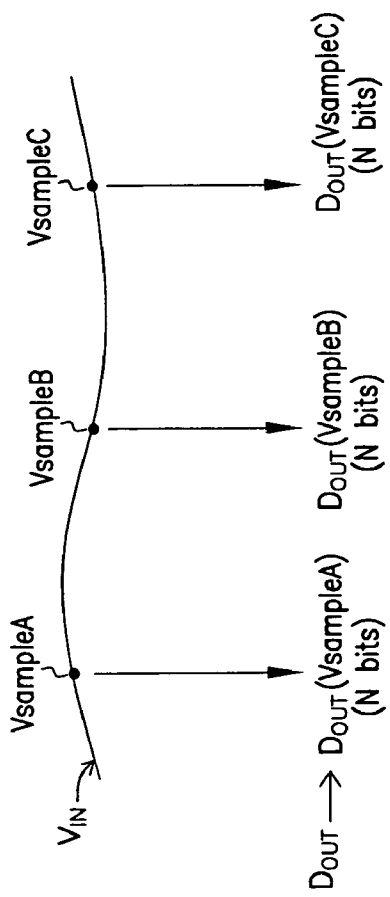
FIG. 4 shows an example of an analog input signal that the ADC of FIG. 3 may receive and convert into a digital signal.
FIG. 5 is an example table showing a relationship between some of the signals of the ADC of FIG. 3.

FIG. 4 shows an example of the $V_{IN}$ signal that ADC 301 of FIG. 3 may receive and convert it into the $D_{OUT}$ signal. ADC 301 may use converting module 304 to sample the $V_{IN}$ signal (FIG. 4) to obtain a number of samples VsampleA, VsampleB, and VsampleC. Each of these samples may include a voltage value corresponding to a part of the $V_{IN}$ signal where the sample is taken. For each of these samples, ADC 301 may generate a number of bits to represent a digital value of each sample. As shown in FIG. 4, the $D_{OUT}$ signal may include different parts such as $D_{OUT}$(VsampleA), $D_{OUT}$(VsampleB), and $D_{OUT}$ (VsampleC); each of these parts may include the same number of bits (e.g., N bits) to represent the digital value of the corresponding sample. The number of N bits (where N is an integer) may correspond to the resolution of ADC 301. For example, if the resolution of ADC 301 is ten, then N=10.

For each of the samples VsampleA, VsampleB, and VsampleC, converting module 304 may successively perform a number of amplifications (or amplifying operations) to generate a number of residue signals Vresidue$_i$ (FIG. 3) and the intermediate codes $K_i$. Output module 305 may store the intermediate codes $K_i$ and then use them to generate the $D_{OUT}$ signal. Output module 305 may include components to perform digital correction during generation of the $D_{OUT}$ signal. The index "i" of Vresidue$_i$ and $K_i$ in FIG. 3 may have a value from zero to N−2 where N is the resolution of ADC 301. Thus, the residue signals may include Vresidue$_0$ through Vresidue$_{N-2}$. The intermediate codes $K_i$ may include $K_0$ through $K_{N-2}$.

The description herein may use Vresidue$_i$ to describe either a single residue signal or a number (plurality) of residue signals. Similarly, the description herein may use $K_i$ to describe either a single intermediate code or a number of intermediate codes.

As shown in FIG. 3, ADC 301 may include a sub-ADC unit 314 to generate the intermediate codes $K_i$. Sub-ADC unit 314 may switch between receiving $V_{IN}$ and receiving Vresidue$_i$ to generate the intermediate codes $K_i$. For example, sub-ADC unit 314 may receive a sample of the $V_{IN}$ signal (e.g., VsampleA) and generate a first intermediate code $K_i$ (e.g., $K_0$) based on the value of the sample. Then, sub-ADC unit 314 may switch to receiving the residue signals Vresidue$_i$ (which is generated from the sample) and generate other intermediate codes such as $K_1$ through $K_{N-2}$.

As shown in FIG. 3, converting module 304 may also include a sub-DAC unit 316 to generate a signal Vref12 at a node 312 and a signal Vref34 at a node 334 based on the values of intermediate codes $K_0$ through $K_{N-2}$. Converting unit 310 may use signals $V_{IN}$, Vref12, and Vref34 to generate residue signals Vresidue$_0$ and Vresidue$_1$ through Vresidue$_{N-2}$.

Sub-ADC unit 314 and sub-DAC unit 316 may include structures and operations in ways similar to sub-ADC and sub-DAC units, respectively, of a conventional cyclic pipeline ADC or a pipeline ADC. Thus, the description herein omits detailed description and operation of sub-ADC unit 314 and sub-DAC unit 316 to help focus on the embodiments described herein.

In general, sub-ADC unit 314 may include a conventional 1.5 bit-ADC or other low resolution ADC (e.g., one, two, three bits, or the like) to generate codes such as the intermediate codes $K_i$. For example, the sub-ADC unit 314 may compare the voltage value of a sample (e.g., VsampleA) with some range of reference voltage values and to generate a first intermediate code (e.g., $K_0$) having one of possible three values of states (e.g., 10, 01, or 00 for a 1.5 bit-ADC) based on the result of the comparison. Then, sub-ADC unit 314 may compare the voltage value of the residue signals Vresidue$_i$ (e.g., Vresidue$_1$ through Vresidue$_{N-2}$ generated from the sample) to generate corresponding other codes $K_i$ (e.g., $K_1$ through $K_{N-2}$) Based on the value of intermediate code $K_i$, sub-DAC unit 316 may selectively couple node 312 to different voltage values. For example, sub-DAC unit 316 may couple node 312 to a first, second, or third voltage value (e.g., Vref$_X$, Vref$_Y$, or Vref$_Z$ of FIG. 2) when intermediate code $K_i$ has values of 10, 01, and 00, respectively. Thus, the Vref12 signal at node 321 may have a value equal to the first, second, or third voltage value at different times, depending on the value of intermediate code $K_i$. Similarly, sub-DAC unit 316 may selectively couple node 334 to different voltage values based on the value of intermediate code $K_i$. For example, sub-DAC unit 316 may couple node 334 to a first, second, or third voltage value (e.g., Vref$_X$, Vref$_Y$, or Vref$_Z$ of FIG. 2) when intermediate code $K_i$ has value 10, 01, and 00, respectively. Thus, the Vref34 signal may have a value equal to the first, second, or third voltage value at different times, depending on the value of intermediate code $K_i$.

Some components of ADC 301 may include features similar to that of a conventional ADC such as a conventional cyclic pipeline ADC (sometimes called algorithmic pipeline ADC), or similar to a single stage of a conventional pipeline ADC. As is known to those skilled in the art, a conventional ADC such as a conventional cyclic pipeline ADC or a pipeline ADC often include one or more sample and hold (S/H) units. The conventional S/H units usually hold a sample (such as VsampleA, VsampleB, or VsampleC of FIG. 4) or a residue signal (such as Vresidue$_i$ of FIG. 3), or both, to retain the value of the sample or the residue signal during a conversion of the sample. As shown in FIG. 3, ADC 301 does not include a unit such as the S/H unit in a conventional cyclic pipeline ADC or a pipeline ADC. Without an S/H unit in ADC 301, the $V_{IN}$ signal may directly couple to converting unit 310. Therefore, in comparison to a conventional ADC such as a conventional cyclic pipeline ADC or a pipeline ADC, ADC 301 may have a relatively smaller size, less power consumption, and/or less susceptible to design challenges related to conventional S/H units.

FIG. 5 is an example table 500 showing a relationship between some of the signals of ADC 301 of FIG. 3. In FIG. 5, T0, T1, and T2 through T(N−2) represent time intervals. At time interval T0, ADC 301 may begin receiving a sample (e.g., VsampleA) and generate a first code $K_0$. Then, from time intervals T1 through T(N−2) ADC 301 may generate residue signals Vresidue$_1$ and Vresidue$_2$ through Vresidue$_{N-2}$. ADC 301 may also generate corresponding intermediate code $K_1$ and intermediate code $K_2$ through intermediate code $K_{N-2}$. Each of the intermediate codes $K_0$ through $K_{N-2}$ may include the same number of M bits (where M is an integer). The number of M bits may depend on the resolution of sub-ADC unit 314. Sub-ADC unit 314 may have a low resolution such that M may include two or three bits, or other number of bits less than the resolution of ADC 301 (less than N bits). Based on the values of intermediate codes $K_0$ through $K_{N-2}$, output module 305 may generate a number of N bits represented by $D_{OUT}$ (VsampleA), using techniques known to those skilled in the art. For example, output module 305 may include storage elements to store intermediate codes $K_0$ through $K_{N-2}$, which may be serially provided to output module 305 from sub-ADC unit 314. Then, output module 305 may combine (e.g., interpolate) the intermediate codes $K_i$ to generate the N bits. Table 500 shows the relationship among some of the signals of ADC 301 of FIG. 3 for one sample (e.g., the sample VsampleA) of the $V_{IN}$ signal. Each of the other samples (e.g., VsampleB and VsampleC) may have a similar table.

Figure 6:
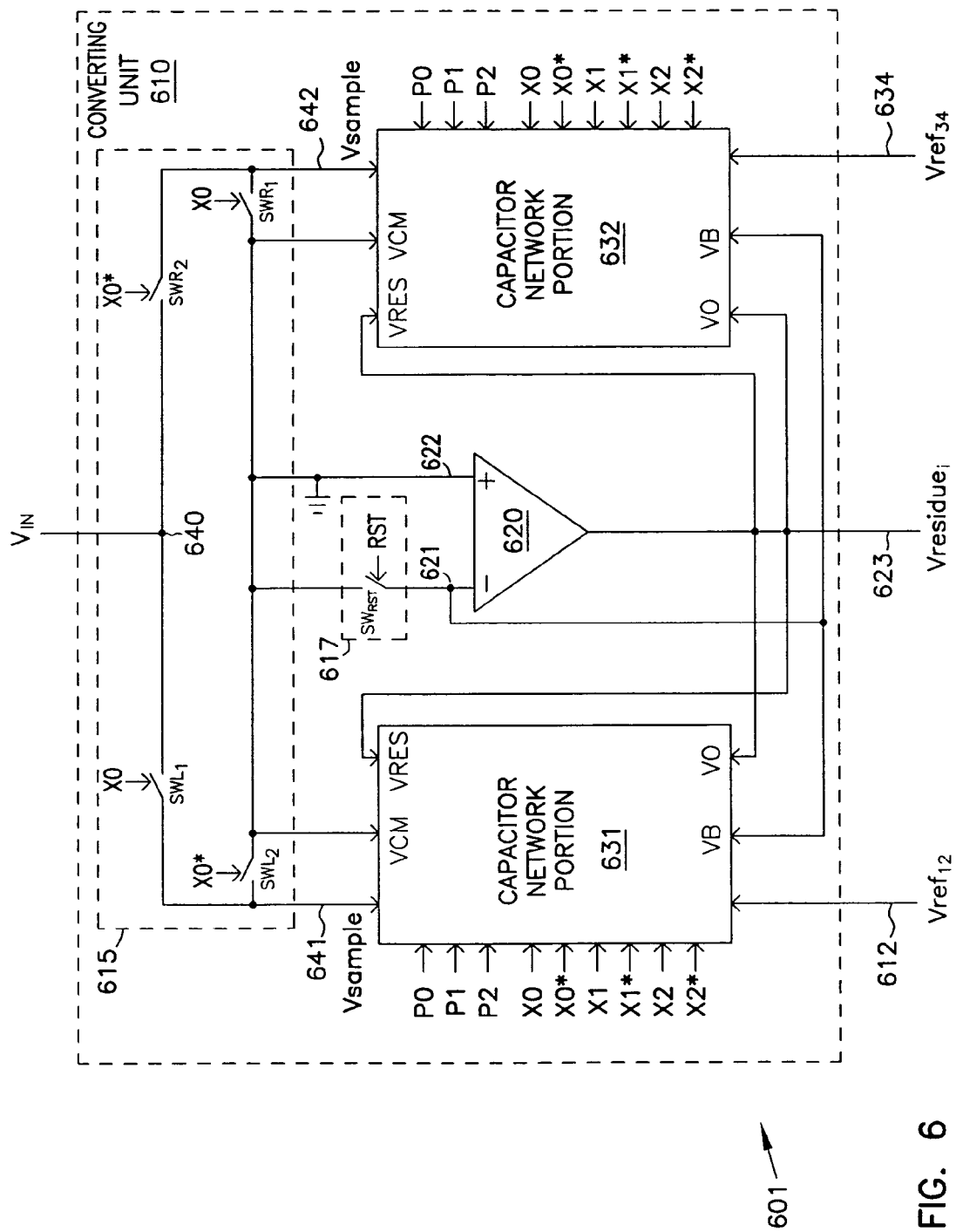
FIG. 6 shows an ADC having a symmetrical converting unit according to an embodiment of the invention.

FIG. 6 shows an ADC 601 having a symmetrical converting unit 610 according to an embodiment of the invention. ADC 601 may also include other features similar to or identical to those of ADC 301 such as a sub-ADC unit 314, a sub-DAC unit 316, and an output module 305. However, to help focus on the embodiment described herein, FIG. 6 omits other features of ADC 601 and concentrates on converting unit 610, which may correspond to converting unit 310 of FIG. 3.

Figure 7:
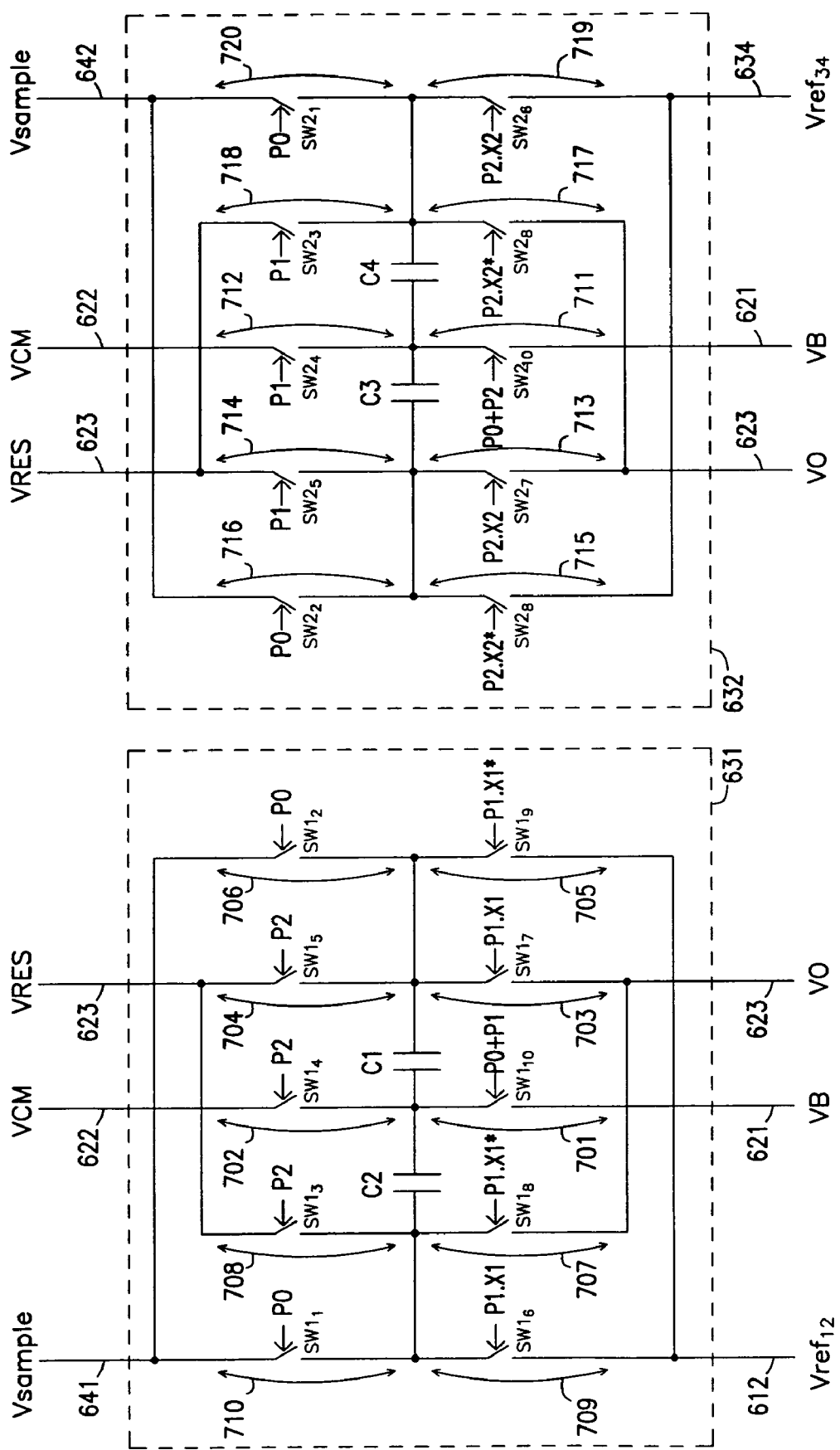
FIG. 7 shows an example capacitor network for the ADC of FIG. 6.

As shown in FIG. 6, converting unit 610 may include a selector circuit 615, a reset circuit 617, an amplifier 620, and a capacitor network having capacitor network portions 631 and 632 coupled to amplifier 620 in a symmetrical configuration. Details of capacitor network portions 631 and 632 are shown in FIG. 7. In FIG. 6, amplifier 620 may include amplifier input nodes 621 and 622, and an amplifier output node 623 to provide a residue signal Vresidue$_i$ (or a number of the Vresidue$_i$ signals at different times). ADC 601 may include signals that are similar to or identical to those of ADC 301 of FIG. 3, such as Vin, Vref12 at a reference node 612, Vref34 at a reference node 634, and P0, P1, P2, X0, X0*, X1, X1*, X2, X2*, and RST. Signals X0*, X1*, and X2* may include complementary (e.g., opposite or inverted) phase of signals X0, X1, and X2, respectively.

Selector circuit 615 may include different modes to select which one of capacitor network portions 631 and 632 to receive a sample of the V$_{IN}$ signal at the beginning of a conversion. The conversion described herein may include receiving a sample (e.g., VsampleA) and performing a number of operations (e.g., amplifications) to generate a number bits (e.g., N bits) corresponding to the value (e.g., voltage value) of the sample. Selector circuit 615 may use signals X0 and X0* having opposite phases to control switches SWL$_1$, SWL$_2$, SWR$_1$, SWR$_2$ to put selector circuit 615 in different modes. Selector circuit 615 may have a first mode when switches SWL$_1$ and SWR$_1$ are turned on (e.g., when X0=1) and switch SWL$_2$ and SWR$_2$ are turn off (e.g., X0*=0). In the first mode, selector circuit 615 may couple input node 641 to node 640 (via switch SWL$_1$) to select capacitor network portion 631 to receive a sample of the V$_{IN}$ signal at the beginning of a conversion. Also in the first mode, selector circuit 615 may couple capacitor network portion 632 to amplifier input node 622 (via switch SWR$_1$) at the beginning of the conversion. Selector circuit 615 may have a second mode when SWR$_2$ and SWL$_2$ are turned on (e.g., when X0*=1) and switch SWL$_1$ and SWR$_1$ are turned off (e.g., when X0=0). In the second mode, selector circuit 615 may couple input node 642 to node 640 (via switch SWR$_2$) to select capacitor network portion 632 to receive a sample of the V$_{IN}$ signal at the beginning of a conversion. Also in the second mode, selector circuit 615 may couple capacitor network portion 631 to amplifier input node 622 (via switch SWL$_2$) at the beginning of the conversion. FIG. 6 shows Vsample at each of input nodes 641 and 642 to indicate that either capacitor network portion 631 or 632 may receive a sample of the V$_{IN}$ signal at the beginning of a conversion, depending on the mode of selector circuit 615.

Reset circuit 617 may reset (or performing a reset to) amplifier 620 at a time such as at the beginning of a conversion of each sample. Reset circuit 617 may reset amplifier 620 by using a signal RST to turn on a switch SW$_{RST}$ to connect amplifier input nodes 621 and 622 to each other so that they may have an equal voltage value (e.g., a common mode voltage value, which may include ground potential). During a reset, amplifier input nodes 621 and 622 may have a voltage value approximately equal to a mid-point voltage value of a voltage value range of the V$_{IN}$ signal. The mid-point voltage value may include a ground potential or some other value (e.g., one-half of the supply voltage value of ADC 601). During a reset, amplifier 620 and capacitor network portions 631 and 632 may have an arrangement such that the Vresidue$_i$ signal at amplifier output node 623 may have a reset voltage value at the beginning of each conversion. The reset voltage value may include a ground potential.

Converting unit 610 may arrange capacitor network portions 631 and 632 and amplifier 620 in different arrangements (e.g., using different connections) at different times, depending on which operation within a conversion is being performed by converting unit 610. Each of capacitor network portions 631 and 632 may include a number of capacitors and switches to form switch capacitor circuitry, which is shown in details in FIG. 7. For ease of viewing the connections of components in FIG. 6 and FIG. 7, FIG. 6 also shows labels, such as VCM, VRES, VB, and VO, at various nodes coupled to amplifier 620 and capacitor network portions 631 and 632.

FIG. 7 shows capacitor network portions 631 and 632 of FIG. 6 including capacitors C1, C2, C3, C4 and a number of switches according to an embodiment of the invention. Capacitor network portion 631 may include a pair of capacitors C1 and C2, and switches SW1$_1$, SW1$_2$, SW1$_3$, SW1$_4$, SW1$_5$, SW1$_6$, SW1$_7$, SW1$_8$, SW1$_9$, and SW1$_{10}$ (collectively called switches SW1). Capacitor network 632 may include a pair of capacitors C3 and C4, and switches SW2$_1$, SW2$_2$, SW2$_3$, SW2$_4$, SW2$_5$, SW2$_6$, SW2$_7$, SW2$_8$, SW2$_9$, and SW2$_{10}$ (collectively called switches SW2). Capacitors C1, C2, C3, and C4 may have an equal value.

Each of switches SW1 and SW2 may be controlled by one or combination of the signals P0, P1, P2, X0, X1, X2, X0*, X1*, and X2*. In FIG. 7, a combination of signals is presented by either a "dot" or a "plus" sign between the signals. The dot indicates a logical "AND" (or a product) of two signals. The plus sign indicates a logical "OR" (or a sum) of two signals. For example, P1.X1 (at switch SW1$_6$) indicates a logical AND of the P1 and X1 signals. In another example, P0+P1 (at switch SW1$_{10}$) indicates a logical OR of the P0 and P1 signals. ADC 601 may include circuit components such as logic gates (e.g., AND and OR gates) to provide logical combination of the signals shown in FIG. 7.

As shown in FIG. 7, capacitor C1 may be coupled to amplifier input node 621 via a path 701, to amplifier input node 622 via a path 702, to amplifier output node 623 via paths 703 and 704, to reference node 612 via a path 705, and to node 641 via a path 706. Capacitor C2 may be coupled to amplifier input node 621 via path 701, to amplifier input node 622 via path 702, to amplifier output node 623 via paths 707 and 708, to reference node 612 via a path 709, and to node 641 via a path 710.

Capacitor C3 may be coupled to amplifier input node 621 via a path 711, to amplifier input node 622 via a path 712, to amplifier output node 623 via paths 713 and 714, to reference node 634 via a path 715, and to node 642 via a path 716. Capacitor C4 may be coupled to amplifier input node 621 via a path 711, to amplifier input node 622 via a path 712, to amplifier output node 623 via paths 717 and 718, to reference node 634 via a path 719, and to node 642 via a path 720.

During a conversion, based on the values of signals P0, P1, P2, X0, X0*, X1, X1*, X2, and X2*, some of switches SW1 and SW2 may turn on and some of these switches may turn off to selectively couple capacitors C1, C2, C3, and C4 to node 641, node 642, reference node 612, reference node 634, amplifier input nodes 621 and 622, and amplifier output node 623 via some combinations of paths 701 through 710 and paths 711 through 720.

Figure 8:
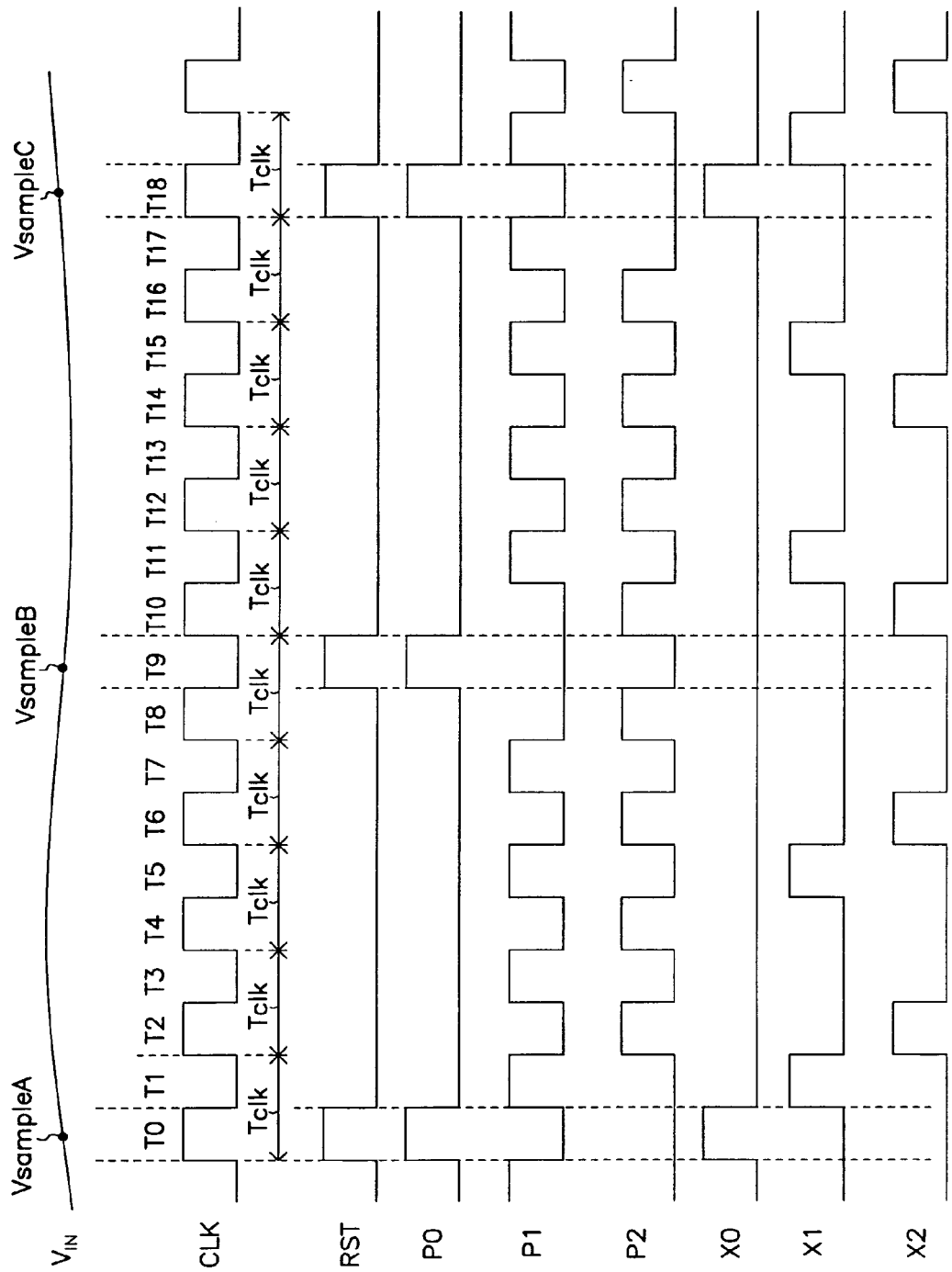
FIG. 8 shows an example timing diagram for the signals of the ADC of FIG. 6.

FIG. 8 shows an example timing diagram for the ADC 601 signals of FIG. 6 and FIG. 7. For clarity, FIG. 8 omits complementary phases (X0*, X1*, and X2*) of signals X0, X1, and X2. The CLK signal in FIG. 8 may include a clock signal. In FIG. 8, T0, T1, T2, T3, T4, T5, T6, T7, T8, T9, T10, T11, T12, T13, T14, T15, T16, T17, and T18 represent time intervals, which may have an equal value. The CLK signal may include a period Tclk. As shown in FIG. 8, the period Tclk may have a duration (time value) equal to two of these time intervals (e.g., period Tclk=T0+T1, or period Tclk=T1+T2). Thus, each of time intervals T0 through T18 may have a value equal to one-half (½) of period Tclk.

As described above with reference to FIG. 6, reset circuit 617 may use the RST signal to reset amplifier 620 at the beginning of a conversion. In FIG. 8, the reset may occur at time intervals T0, T9, and T18 when converting unit 610 is ready to receive or receiving a new sample (e.g., VsampleA, VsampleB, or VsampleC) from the $V_{IN}$ signal.

Converting unit 610 may use the P0 signal to sample the $V_{IN}$ signal at time intervals T0, T9, and T18 to obtain three different samples (e.g., VsampleA, VsampleB, and VsampleC, respectively). The frequency of the P0 signal may correspond to the sampling frequency of ADC 601 (FIG. 6). FIG. 8 shows an example timing diagram where ADC 601 has an example resolution of ten bits (N=10). Therefore, for each of samples VsampleA, VsampleB, and VsampleC, ADC 601 (FIG. 6) may perform a conversion to generate ten bits to represent the analog value of each sample.

As described above with reference to FIG. 6, selector circuit 615 may use the X0 signal to change between different modes to select which one of capacitor network portions 631 and 632 to receive the sample at the beginning of each conversion. As shown in FIG. 8, the X0 signal may have values of X0=1 at time interval T0, X0=0 at time T9, and back to X0=1 at time interval 18. Thus, based on the values of X0 signal, selector circuit 615 may have a first mode at time interval T0 (when X0=1) to select capacitor network portion 631 to receive the sample VsampleA, a second mode at time interval T9 (when X0=0) to select capacitor network portion 632 to receive the sample VsampleB, and the first mode again at time interval T18 to select capacitor network portion 631 to receive the sample VsampleC.

Converting unit 610 may use the other signals P1, P2, X1, and X2 with the timing as shown in FIG. 8 to couple amplifier 620 and capacitor network portions 631 and 632 in different arrangements during a conversion.

FIG. 9 is an example chart 999 showing various arrangements 900, 901, 902, 903, and 904 of converting unit 610 of ADC 601 of FIG. 6 and FIG. 7 during a conversion of a sample (e.g., VsampleA) of the $V_{IN}$ signal. Arrangements 900, 901, 902, 903, and 904 illustrate different circuit connections among capacitors C1, C2, C3, and C4 and amplifier 620 during a conversion when some of switches $SW_{RST}$, $SWL_1$, $SWL_2$, $SWR_1$, $SWR_2$, SW1, and SW2 are turned on and some of these switches are turned off, based on the values of signals RST, P0, P1, P2, X0, X0*, X1, X1*, X2, and X2* at different time intervals (FIG. 8) during a conversion of a sample. For example, converting unit 610 may have arrangement 900 during time interval T0, at which switches $SW_1$, $SW_2$, and $SW_{10}$ (FIG. 7) in each of capacitor network portions 631 and 632 are turned on and the others switches are turned off. In another example, converting unit 610 may have arrangement 901 during time interval T1, at which switches $SW_6$, $SW_7$, and $SW_{10}$ in capacitor network portion 631 are turned on, switches $SW_3$, $SW_4$, and $SW_5$ in capacitor network portion 632 are turned on, and other switches of capacitor network portions 631 and 632 are turned off. For clarity FIG. 9 omits switches $SW_{RST}$, $SWL_1$, $SWL_2$, $SWR_1$, $SWR_2$, SW1, and SW2 from arrangements 900, 901, 902, 903, and 904 (whether the switches are turned on or off).

As shown in FIG. 9, arrangements 900, 901, 902, 903, and 904 may include different paths coupled to amplifier 620, such as a feedback path 923 between amplifier input node 621 and amplifier output node 623, a reference path 912 between amplifier input node 621 and reference node 612, and a reference path 934 between amplifier input node 621 and reference node 634.

During a conversion, capacitors C1 and C2 may alternately form feedback path 923 and reference path 912 in different arrangements. For example, in arrangements 901, capacitor C1 may form feedback path 923 (which may include paths 701 and 703 of capacitor network portion 631 of FIG. 7) and capacitor C2 may form reference path 912 (which may include path 709 of capacitor network portion 631 of FIG. 7). Then, in arrangement 903, capacitors C2 may form feedback path 923 (which may include paths 701 and 707 of capacitor network portion 631 of FIG. 7) and capacitor C1 may form reference path 912 (which may include paths 705 of capacitor network portion 631 of FIG. 7).

Similarly, during a conversion, capacitors C3 and C4 may alternately form feedback path 923 and reference path 934 in different arrangements. For example, in arrangements 902, capacitor C3 may form feedback path 923 (which may include paths 711 and 713 of capacitor network portion 632 of FIG. 7) and capacitor C4 may form reference path 934 (which may include path 719 of capacitor network portion 632 of FIG. 7). Then, in arrangement 904, capacitors C4 may form feedback path 923 (which may include paths 711 and 717 of capacitor network portion 632 of FIG. 7), and capacitor C3 may form reference path 934 (which may include path 715 of capacitor network portion 632 of FIG. 7).

As shown in FIG. 9, capacitor pair C1 and C2 and capacitor pair C3 and C4 may also alternately couple to amplifier 620 to perform different functions between the pairs. For example, in arrangement 901, capacitor pair C1 and C2 and amplifier 620 may perform the amplifying function to generate the $Vresidue_1$ signal at amplifier output node 623, while capacitor pair C3 and C4 may couple to amplifier output node 623 to perform the storing function to store a voltage value of the $Vresidue_1$ signal. Then, in arrangement 902, capacitor pair C3 and C4 (alternating with capacitor pair C1 and C2) and amplifier 620 may perform the amplifying function to generate the $Vresidue_2$ signal at amplifier output node 623, while capacitor pair C1 and C2 may couple to amplifier output node 623 to perform the storing function to store a voltage value of the $Vresidue_2$ signal.

Converting unit 610 may perform a conversion for each sample using these arrangements in sequential order as shown in FIG. 9 (e.g., starting from arrangement 900) to successively generate residue signals $Vresidue_0$ and $Vresidue_1$ through $Vresidue_{N-2}$. Since the resolution of ADC 601 is assumed to be ten (N=10), $Vresidue_{N-2}$ in FIG. 9 is $Vresidue_8$. ADC 601 may use a sub-ADC unit (similar to sub-ADC unit 314 of FIG. 3) to generate a number of intermediate codes $K_0$ through $K_{N-2}$ corresponding to the $Vresidue_0$ through $Vresidue_{N-2}$ signals. ADC 601 may also use a sub-DAC unit (similar to sub-DAC unit 316 of FIG. 3) to generate the Vref12 and Vref34 signals, each of which may have a value based on the value of the intermediate codes $K_0$ through $K_{N-2}$.

As shown in FIG. 9, converting unit 610 may begin a conversion at time interval T0 with arrangement 900 to reset amplifier 620 and receive a sample (e.g., VsampleA). During the reset, the first residue signal (e.g., $Vresidue_0$) in arrangement 900 may have a voltage value equal to or substantially equal to zero.

Converting unit 610 may perform activities such as a number of consecutive amplifications 1, 2, 3, and 4 (at time intervals T1, T2, T3, and T4, respectively) in arrangements 901, 902, 903, and 904, respectively, to generate corresponding signals the $Vresidue_1$, $Vresidue_2$, $Vresidue_3$, and $Vresidue_4$. These residue signals may have values calculated from equations 1, 2, 3, and 4 below. In equation 1, Vsample represents a value of a sample (e.g., VsampleA) of the $V_{IN}$ signal.

$$Vresidue_1=[((C1+C2)/C1)Vsample]-[(C2/C1)Vref_{12}] \quad (1)$$

$$Vresidue_2=[((C3+C4)/C3)Vresidue_1]-[(C4/C3)Vref_{34}] \quad (2)$$

$$Vresidue_3=[((C1+C2)/C2)Vresidue_2]-[(C1/C2)Vref_{12}] \quad (3)$$

$$Vresidue_4=[((C3+C4)/C4)Vresidue_3]-[(C3/C4)Vref_{34}] \quad (4)$$

Since ADC 601 has an example resolution of ten (N=10), converting unit 610 of ADC 601 may perform N−2 consecutive amplifications to generate N−2 residue signals (from $Vresidue_1$ to $Vresidue_{N-2}$). FIG. 9 shows only four amplifications 1, 2, 3, and 4. However, converting unit 610 may perform amplifications 5, 6, 7, and 8 by repeating arrangements 901, 902, 903, and 904 at time intervals T5, T6, T7, and T8, respectively, to generate corresponding residue signals $Vresidue_5$, $Vresidue_6$, $Vresidue_7$, and $Vresidue_8$. ADC 601 of FIG. 6 may also generate intermediate codes $K_5$, $K_6$, $K_7$, and $K_8$ corresponding to the $Vresidue_5$, $Vresidue_6$, $Vresidue_7$, and $Vresidue_8$ signals. ADC 601 may use intermediate codes $K_0$ through $K_8$ to generate a digital signal (e.g., similar to $D_{OUT}$ of FIG. 3) to represent a digital value of the sample being converted (e.g., VsampleA).

As described above, converting unit 610 may use different arrangement of capacitors C1, C2, C3, and C4 and amplifier 620 during a conversion of a sample and various calculations for residue signals as shown in equations 1, 2, 3, and 4. Since each of equations 1, 2, 3, and 4 has different combinations of capacitors C1, C2, C3, and C4, mismatches among values of capacitors C1, C2, C3, and C4 may be spread over multiple operations and calculations. Therefore, the affect of mismatches in values among capacitors C1, C2, C3, and C4 may be reduced. Thus, performance of ADC 601 may be improved.

As shown in FIG. 8, converting unit 610 may receive other samples such as VsampleB at time interval T9 and VsampleC at time interval T18. Converting unit 610 may convert each of samples VsampleB and VsampleC in ways similar to that of the sample VsampleA, for example using capacitors C1 and C2 to receive the sample VsampleB or VsampleC at the beginning of the conversion (e.g., at time interval T9 or T18) and perform activities such as amplifications shown in FIG. 9. However, as shown in FIG. 8, converting unit 610 may change the value of the X0 signal from X0=1 to X0=0 at time interval T9 (FIG. 8). Thus, selector circuit 615 may change its mode at time interval T9 and select capacitors C3 and C4 (instead of C1 and C2) to receive the sample VsampleB at the beginning of a new conversion (conversion of sample VsampleB).

FIG. 10 is an example chart 1099 showing various arrangements 1000, 1001, 1002, 1003, and 1004 of converting unit 610 of FIG. 6 and FIG. 7 during a conversion of the sample VsampleB during time intervals T9 through T17. Chart 1099 is similar to chart 999 except that in chart 1099, capacitors C3 and C4 (instead of C1 and C2) may receive the sample VsampleB at the beginning of a conversion for the sample VsampleB (e.g., at time interval T9 in FIG. 8). Converting unit 610 may generate residue signal $Vresidue_0$ and intermediate code $K_0$ at time interval T0 and perform a number of consecutive amplifications to successively generate residue signals $Vresidue_1$ through $Vresidue_{N-2}$ and intermediate codes $K_1$ through $K_{N-2}$ from time intervals T9 through T17, using the arrangements shown in FIG. 10. The values of $Vresidue_1$ through $Vresidue_{N-2}$ signals in chart 1099 of FIG. 10 may be calculated from equations 1, 2, 3, and 4 above, but with C1 and C3 being exchanged and C2 and C4 being exchanged for each equation.

FIG. 8 shows an example where the X0 signal may have a value X0=1 at time T0 at the beginning of the conversion for the sample VsampleA and X0=0 at time interval T9 at the beginning of the conversion for the sample VsampleB. The X0 signal, however, may have a value of X0=0 (instead of X0=1) at time T0 at the beginning of the conversion for the sample VsampleA and a value of X0=1 (instead of X0=0) at time T9 at the beginning of the conversion for the sample VsampleB. Thus, converting unit 610 may use capacitors C3 and C4 (instead of C1 and C2) to receive the sample VsampleA at time T0 and use capacitors C1 and C2 (instead of C3 and C4) to receive the sample VsampleB at time interval T17. In such case, converting unit 610 may have arrangements of FIG. 10 (instead of FIG. 9) for the conversion of the sample VsampleA and arrangements of FIG. 9 (instead of FIG. 10) for the conversion of the sample VsampleB.

The timing diagram of FIG. 8 and chart 999 of FIG. 9 show an example where the resolution of ADC 601 (FIG. 6) is ten (N=10). For other resolutions, ADC 601 may perform similar activities but with fewer or more amplifications and using fewer or more number of the arrangements. For example, if N=8, then ADC 601 may generate $Vresidue_0$ through $Vresidue_6$ and corresponding intermediate codes $K_0$ through $K_6$, using a sequence with an order of arrangements 900, 901, 902, 903, 904, 901, and 902. In another example, if N=12, then ADC 601 may generate $Vresidue_0$ through $Vresidue_{10}$ and corresponding intermediate codes $K_0$ through $K_{10}$, using a sequence with an order of arrangements 900, 901, 902, 903, 904, 901, 902, 903, 904, 901, and 902.

As shown in FIG. 9 and FIG. 10, converting unit 610 may reset amplifier 620 only one time during the conversion of a sample. For example, converting unit 610 may reset amplifier 620 at time interval T0 (FIG. 9) during the conversion of the sample VsampleA or at time interval T9 (FIG. 10) during the conversion of the sample VsampleB. Thus, during a conversion of a sample, converting unit 610 may perform a number of amplifications without resetting amplifier 620 between at least two consecutive amplifications. Some conventional cyclic pipeline ADC may reset the amplifier (such as amplifier 620) multiple times during a conversion of a sample. For example, during a conversion of a sample, such as VsampleA of FIG. 9, a conventional cyclic pipeline ADC may reset the amplifier multiple times between time intervals T0 and T8. The conventional cyclic pipeline ADC may also reset the amplifier between two consecutive amplifications. For example, during a conversion of a sample such as VsampleA of FIG. 9, a conventional cyclic pipeline ADC may reset the amplifier between amplification 1 and amplification 2, or between amplification 2 and amplification 3, or between amplification 3 and amplification 4, or between two other consecutive amplifications.

Further, as shown in FIG. 9, converting unit 610 may generate one of signals $Vresidue_1$ through $Vresidue_8$ during one of time intervals T1 through T8. In FIG. 8, since period Tclk of the CLK signal may have a value equal to two of time intervals T0 through T18 (in which time intervals T0 through T19 may have an equal value), converting unit 610 may generate two consecutive residue signals among $Vresidue_1$ through $Vresidue_8$ (FIG. 9) in one period Tclk of the CLK signal. Some conventional cyclic pipeline ADC may generate two consecutive residue signals, such as two consecutive signals among $Vresidue_1$ through $Vresidue_8$, in two cycles of a clock signal (such as 2Tclk of the CLK signal). Thus, in comparison to some conventional cyclic pipeline ADC, the ADC 601 of FIG. 6, (which include arrangements of FIG. 9 and FIG. 10) may have less conversion time and an improved sampling rate.

Figure 11:
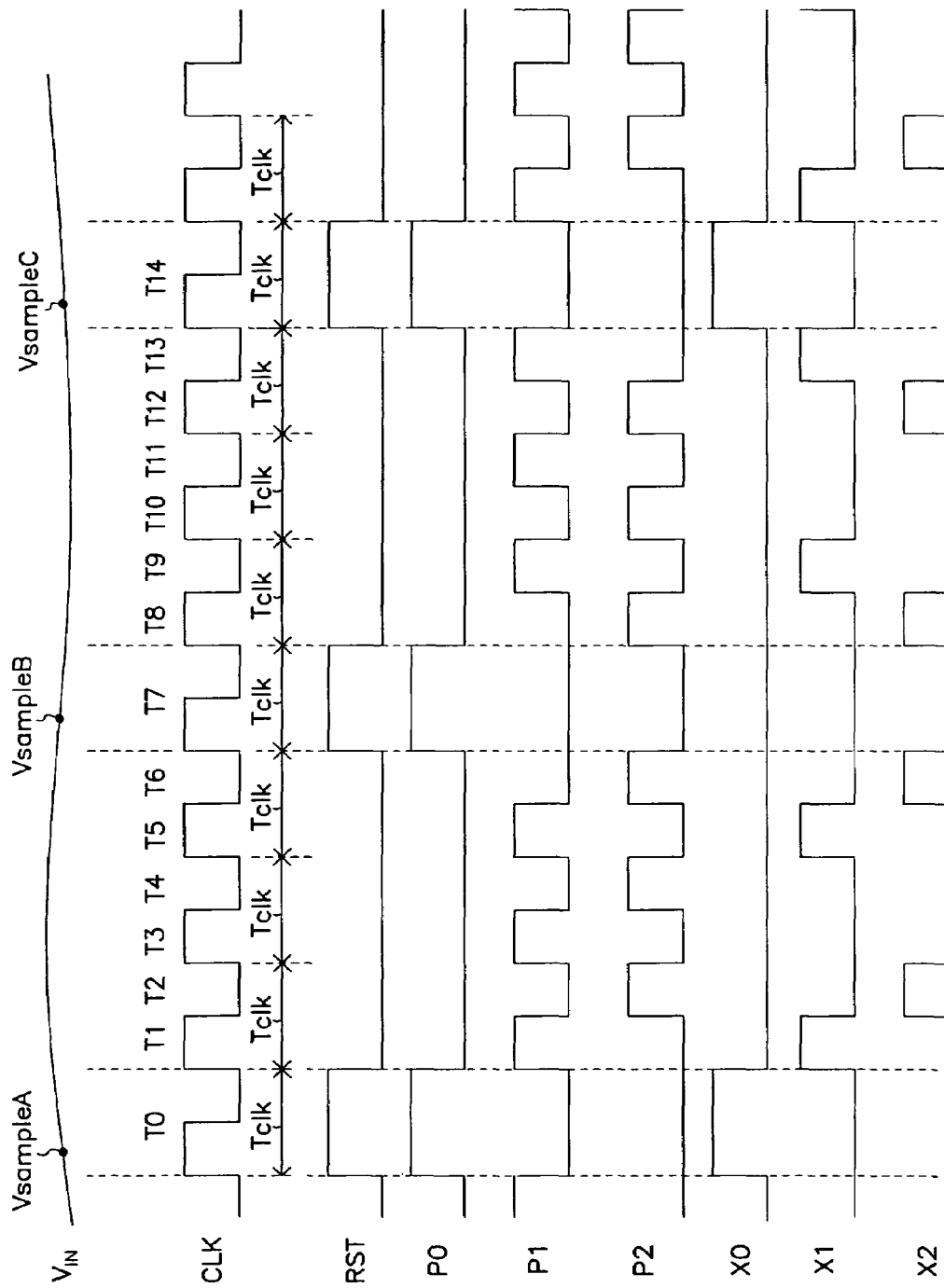
FIG. 11 shows an example timing diagram for the ADC of FIG. 6 with one time interval being greater than the other time intervals.
Figure 12:
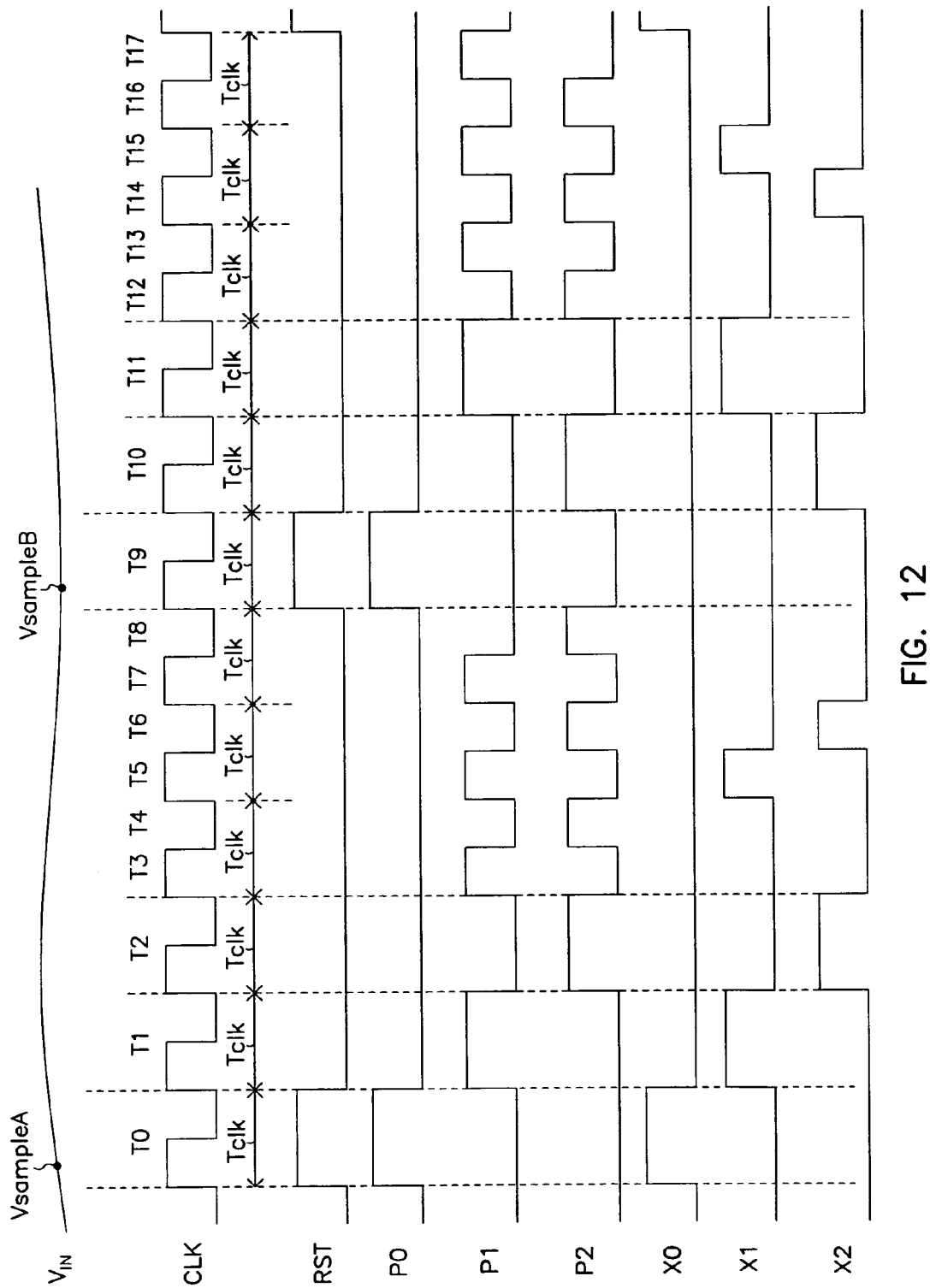
FIG. 12 shows an example timing diagram for the ADC of FIG. 6 showing a number of time intervals being greater than the other time intervals.
Figure 13:
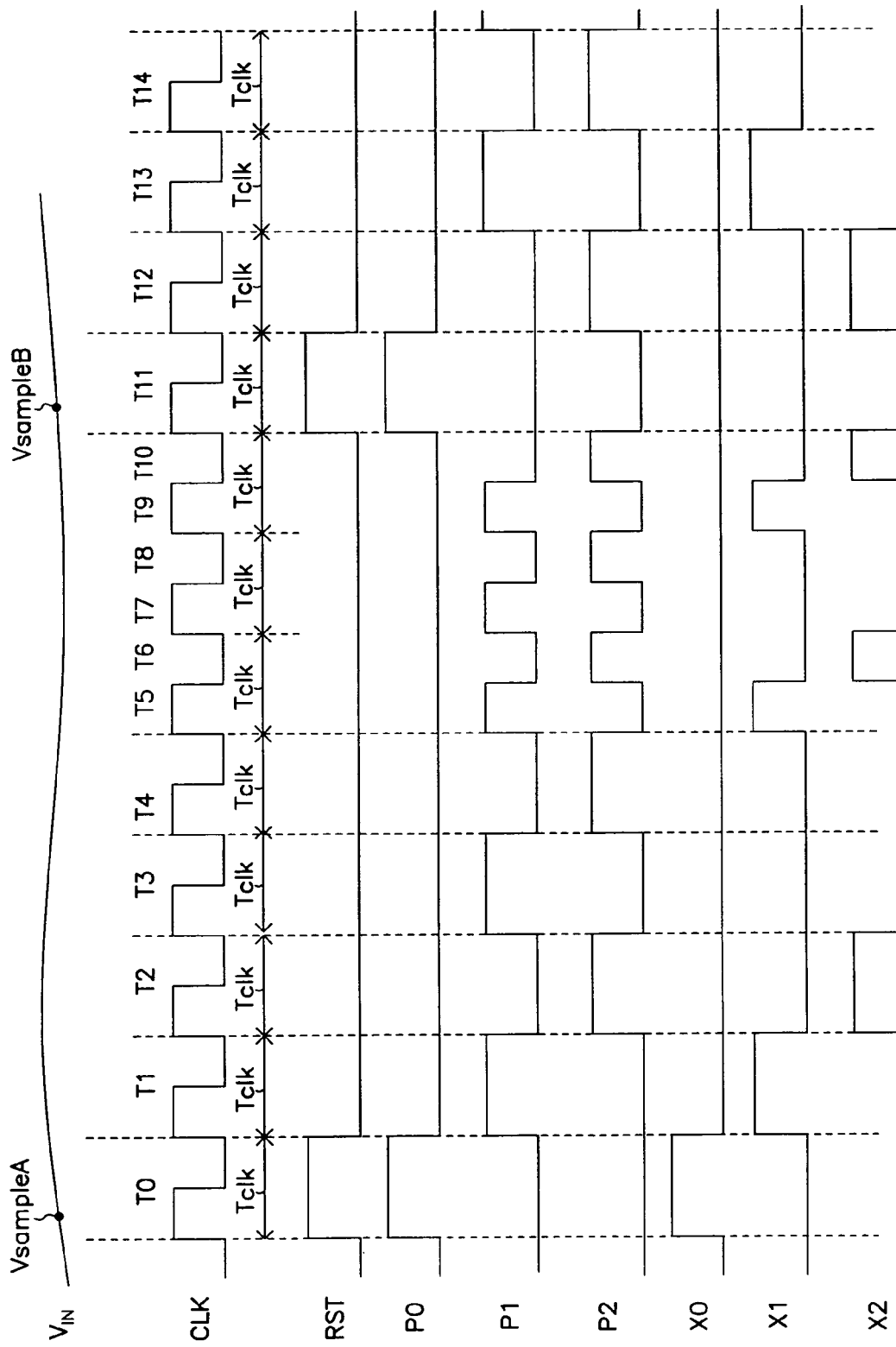
FIG. 13 shows an example timing diagram for the ADC of FIG. 6 showing another number of time intervals being greater than the other time intervals.

As described above with respect to equations 1, 2, 3, and 4, the first residue signal $Vresidue_1$ may be used to generate (or in the calculation of) the second residue signal $Vresidue_2$, in turn, second residue signal may be used to generate (or in the calculation of) the third residue signal $Vresidue_3$, and so on. Since each of the signals $Vresidue_1$ through $Vresidue_{N-2}$ is generated from an amplification (amplifying operation), if an error occurs at the first amplification (e.g., amplification 1 in FIG. 9), then the error may be successively amplified in subsequence amplifications (e.g., amplifications 2, 3, 4, and others), which may affect the accuracy of the ADC. To reduce the error and improve the accuracy, ADC 601 may allocate a greater time interval for some activities of the conversion. For example, ADC 601 may allocate a greater time interval for activities performed at the beginning or near the beginning of a conversion, such as one or more of resetting the amplifier, receiving the sample, and generating one or more of the initial residue signals (e.g., one or more of $Vresidue_1$ through $Vresidue_4$ of FIG. 9 or FIG. 10). FIG. 11, FIG. 12, and FIG. 13 below show additional example timing diagrams for ADC 601 of FIG. 6 with some time intervals being unequal.

FIG. 11 shows an example timing diagram for ADC 601 of FIG. 6 with time interval T0 being greater than the other time intervals such as T3 through T8. FIG. 11 shows an example timing diagram when ADC 601 may have a resolution of eight bits (N=8). As shown in FIG. 11, each of time intervals T0, T7, and T14 may have a value equal to one period Tclk of the CLK signal and each of other time intervals (e.g., T1 through T6, and T8 through T13) may have a value less than Tclk (e.g., ½ Tclk). During time interval T0, ADC 601 may reset amplifier 620 and receive the sample VsampleA. During time intervals T1 through T6, converting unit 610 may perform a number of amplifications (e.g., amplification 1 through amplification 6) to generate residue signals, such as $Vresidue_1$ through $Vresidue_6$, for use in the conversion of the sample VsampleA into a digital value (e.g., N bits). ADC 601 may perform conversion of the sample VsampleB during time intervals T7 through T13, and conversion of the sample VsampleC beginning from time interval T14. As described above, allocating a greater time interval for some activities of a conversion of a sample, such as a greater time during each of time intervals T0, T7, and T14 of FIG. 11, may improve accuracy of the ADC.

FIG. 12 shows an example timing diagram for ADC 601 of FIG. 6 showing each of time intervals T0, T1, and T2 being greater than the other time intervals such as T3 through T8. FIG. 12 shows an example timing diagram when ADC 601 may have a resolution of ten bits (N=10). As shown in FIG. 12, each of time intervals T0, T1, and T2 may have a value equal to one period Tclk of the CLK signal, and each of other time intervals (e.g., T3 through T8 and T12 through T17) may have a value less than Tclk (e.g., ½ Tclk). During time interval T0, ADC 601 may reset amplifier 620 and receive the sample VsampleA. During time intervals T1 through T8, converting unit 610 may perform a number of amplifications (e.g., amplification 1 through amplification 8) to generate residue signals, such as $Vresidue_1$ through $Vresidue_8$. As shown in FIG. 12, since each of time intervals T1 and T2 is greater than each of time intervals T3 and T4, the time interval used to generate residue signals $Vresidue_1$ or $Vresidue_2$ is greater than the time interval to generate residue signal $Vresidue_3$ or $Vresidue_4$ or other $Vresidue_5$ signals through $Vresidue_8$. ADC 601 may perform conversion of the sample VsampleB during time intervals T9 through T17. As described above, allocating a greater time interval for some activities of a conversion of a sample, such as a greater time for the activities during the time interval of each of T0, T1, and T2 in FIG. 12, may improve accuracy of the ADC.

FIG. 13 shows an example timing diagram for ADC 601 of FIG. 6 showing each of time intervals T0, T1, T2, T3, and T4 being greater than the other time intervals such as T5 through T10. FIG. 13 shows an example timing diagram when ADC 601 may have a resolution of 12 bits (N=12). As shown in FIG. 13, each of time intervals T0 through T4 may have a value equal to one period Tclk of the CLK signal, and each of other time intervals T5 through T10 may have a value less than Tclk (e.g., ½ Tclk). During time interval T0, ADC 601 may reset amplifier 620 and receive the sample VsampleA. During time intervals T1 through T10, converting unit 610 may perform a number of amplifications (e.g. amplification 1 through amplification 10, since N=12) to generate residue signals, such as $Vresidue_1$ through $Vresidue_{10}$). For example, ADC 601 may generate residue signals $Vresidue_1$, $Vresidue_2$, $Vresidue_3$, $Vresidue_4$, during time intervals T1, T2, T3, and T4, respectively, and generate residue signals $Vresidue_5$ through $Vresidue_{10}$ during time intervals T5 through T10. As shown in FIG. 13, since each of time intervals T1 through T4 is greater than each of time intervals T5 through T10, the time interval used to generate each of residue signals $Vresidue_1$ through $Vresidue_{10}$ is greater than the time interval to generate each residue signals $Vresidue_5$ through $Vresidue_{10}$. ADC 601 may perform conversion of the sample VsampleB beginning from time interval T11. As described above, allocating a greater time interval for some activities of a conversion of a sample, such as a greater time for the activities during the time interval of each of T0 through T4 of FIG. 13, may improve accuracy of the ADC.

Based on the example timing diagrams shown in FIG. 8, FIG. 11, FIG. 12, and FIG. 13, converting unit 610 may use different conversion times for each sample. For example, in FIG. 8, for a conversion of each of the samples VsampleA, VsampleB, and VsampleC, converting unit 610 may use a conversion time Ts of (N−1)/2 Tclk or a sampling frequency $F_S$ of 2Fclk/(N−1), where N is the resolution of the ADC, Tclk is the period and Fclk is the frequency of a clock signal such the CLK signal. In another example, for a conversion of each of the samples VsampleA, VsampleB, or VsampleC in FIGS. 11, 12, and 13, converting unit 610 may use a conversion time Ts of (N−4) Tclk or a sampling frequency $F_S$ of Fclk/(N−4). Some conventional cyclic pipeline ADC may have a conversion time of (N−1) Tclk or a sampling frequency of Fclk/(N−1). Thus, in comparison with some conventional cyclic pipeline ADC, the ADC 601 may have less conversion time or a greater sampling frequency.

In comparison among the timing diagrams of FIG. 8, and FIGS. 11, 12, and 13, the timing diagram of FIG. 8 may provide ADC 601 with a conversion speed higher (or less conversion time) than that of each of FIGS. 11, 12, and 13. However, since the timing diagram of each of FIGS. 11, 12, and 13 may allocate a greater time interval for some activities of the conversion (such as a greater time interval for T0, or T1 and T2, or T0, T1, T2, T3, and T4), the timing of each of FIGS. 11, 12, and 13 may provide ADC 601 with more accuracy than that of FIG. 8.

Figure 14:
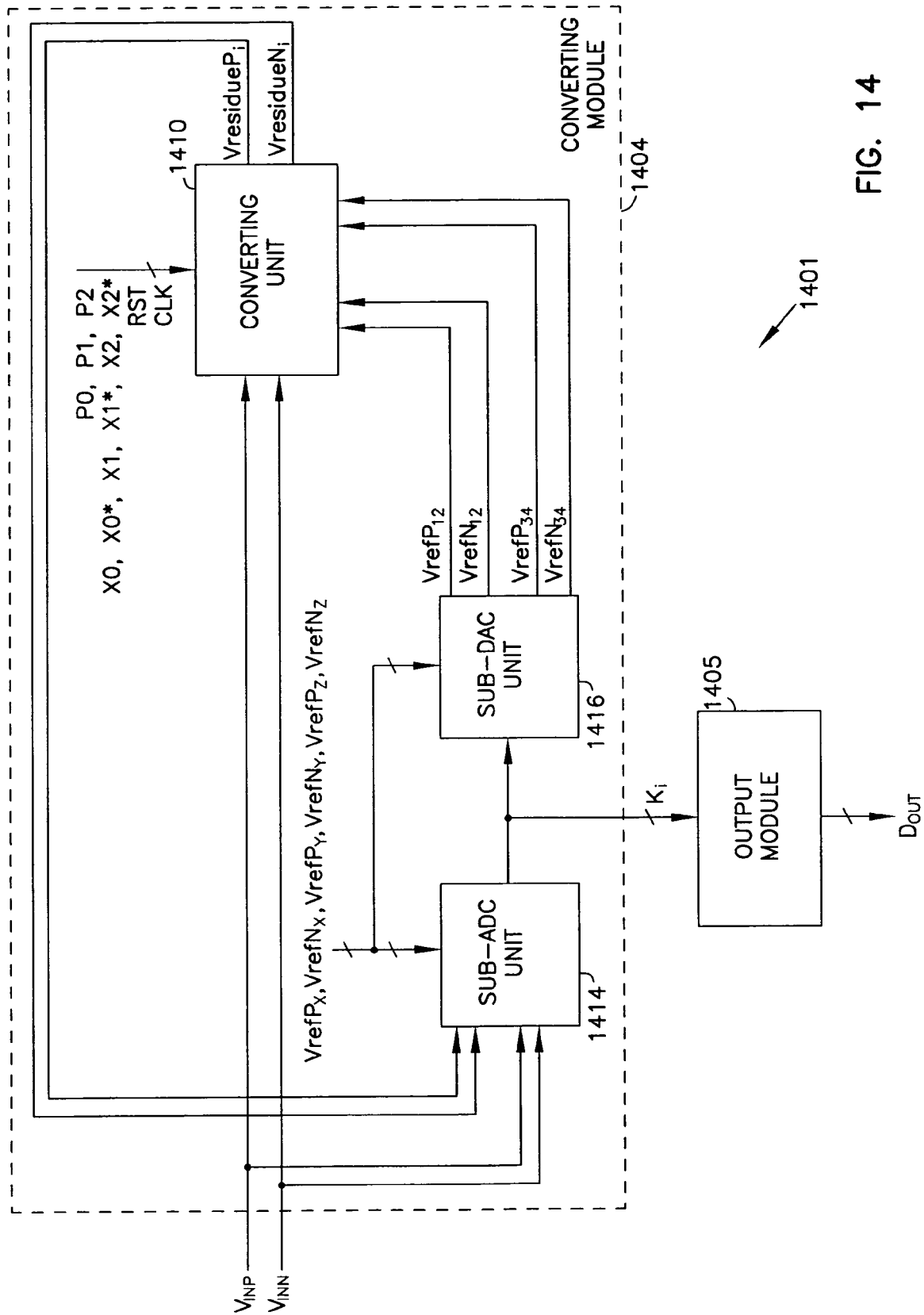
FIG. 14 shows an ADC with a differential configuration according to an embodiment of the invention.

FIG. 14 shows an ADC 1401 with a differential configuration according to an embodiment of the invention. ADC 1401 may include a differential version of ADC 301 of FIG. 3 or ADC 601 of FIG. 6. As shown in FIG. 14, ADC 1401 may include a converting module 1404 to receive an analog input signals $V_{INN}$ and $V_{INP}$, and an output module 1405 to generate a digital output signal $D_{OUT}$ representing a digital value of the $V_{INN}$ and $V_{INP}$ signals. $V_{INN}$ and $V_{INP}$ may form a differential signal corresponding to the Vin signal of FIG. 3 or FIG. 6. In FIG. 14, $V_{INN}$ may form a first component of the different signal and $V_{INP}$ may form a second component of the differential signal. The signals P0, P1, P2, X0, X0*, X1, X1*, X2, X2*, and RST may correspond to those of ADC 301 of FIG. 3. The signals VrefP$_X$, VrefN$_X$, VrefP$_Y$, VrefN$_Y$, VrefP$_Z$, and VrefN$_Z$, may correspond to differential versions of the signals Vref$_X$, Vref$_Y$, and Vref$_Z$, of ADC 301 of FIG. 3. As shown in FIG. 14, converting module 1404 may include a sub-ADC unit 1414 to generate intermediate code K$_i$ based on the V$_{INN}$ and V$_{INP}$ signals and residue signals VresidueP$_i$ and VresidueN$_i$. Converting module 1404 may include a sub-DAC unit 1416 to generate signals VrefP$_{12}$, VrefN$_{12}$, VrefP$_{34}$, and VrefN$_{34}$ based on the values of intermediate code K$_i$. Converting module 1404 may include a converting unit 1410 to receive the signals V$_{INN}$, V$_{INP}$, VrefP$_{12}$, VrefN$_{12}$, VrefP$_{34}$, and VrefN$_{34}$, and generate residue signals VresidueP$_i$ and VresidueN$_i$. The VrefP$_{12}$ and VrefN$_{12}$ signals of FIG. 14 may form a differential signal corresponding to the Vref$_{12}$ signal of FIG. 3 and FIG. 6. The VrefP$_{34}$ and VrefN$_{34}$ signals of FIG. 14 may form a differential signal corresponding to the Vref$_{34}$ signal of FIG. 3 and FIG. 6. The VresidueP$_i$ and VresidueN$_i$ signals of FIG. 14 may form a differential signal corresponding to the Vresidue$_i$ of FIG. 3 and FIG. 6. ADC 1401 may include activities and operate in ways similarly to those of ADC 301 (FIG. 3) or ADC 601 (FIG. 6) but in a differential fashion.

Figure 15:
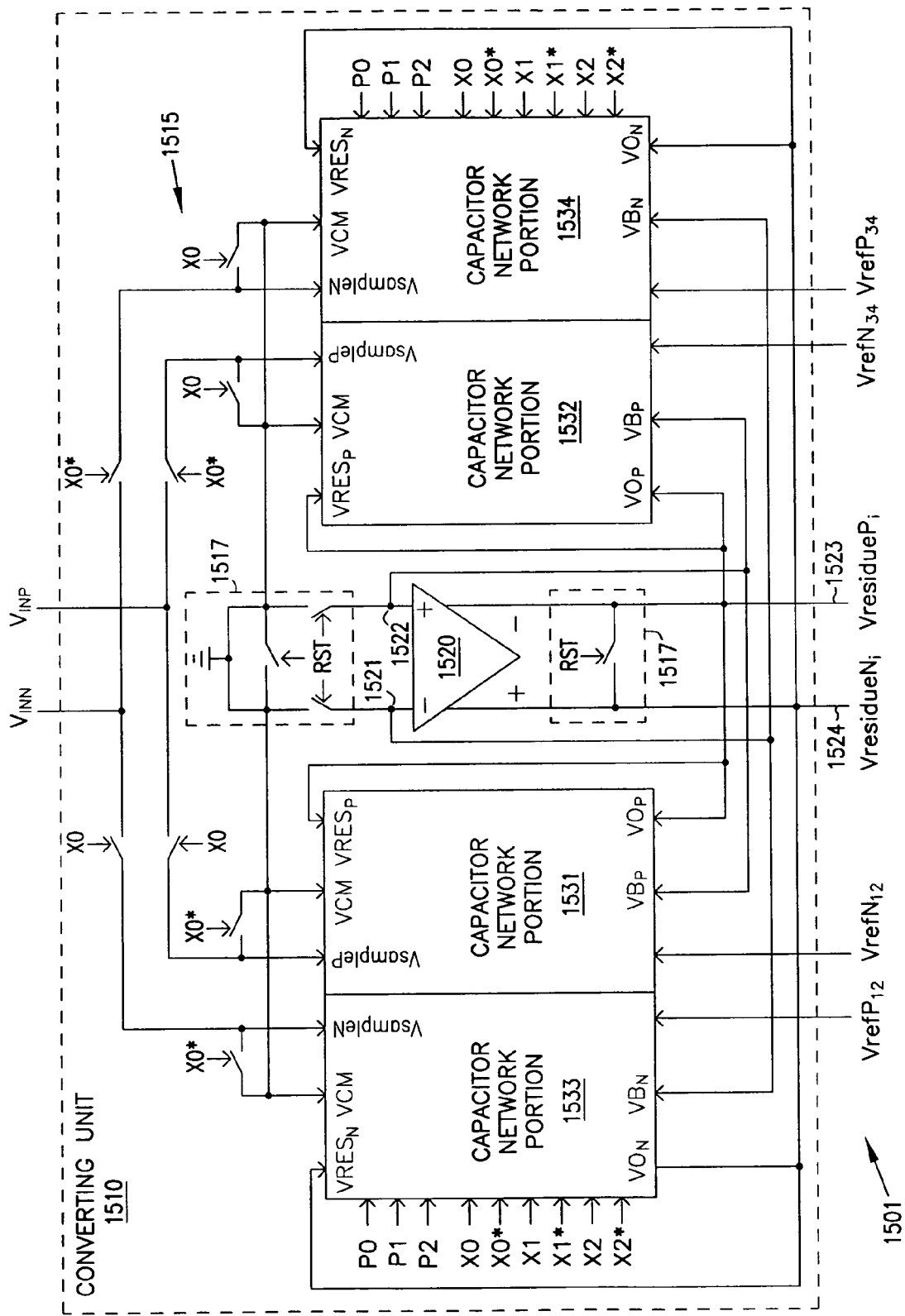
FIG. 15 shows an ADC having a differential capacitor network according to an embodiment of the invention.

FIG. 15 shows an ADC 1501 having a differential capacitor network according to an embodiment of the invention. ADC 1501 may correspond to ADC 1401 of FIG. 14 and ADC 601 of FIG. 6. As shown in FIG. 15, ADC 1501 may include a converting unit 1510. ADC 1501 may also include other features similar to or identical to those of ADC 1401, such as a sub-ADC unit 1414, a sub-DAC unit 1416, and an output module 1405. However, to help focus on the embodiment described herein, FIG. 15 omits other features of ADC 1501 and concentrates on converting unit 1510, which may correspond to a differential version of converting unit 610 of FIG. 6. ADC 1501 may include activities and operate in ways similarly to those of ADC 301 (FIG. 3) and ADC 601 (FIG. 6) but in a differential fashion.

Figure 16:
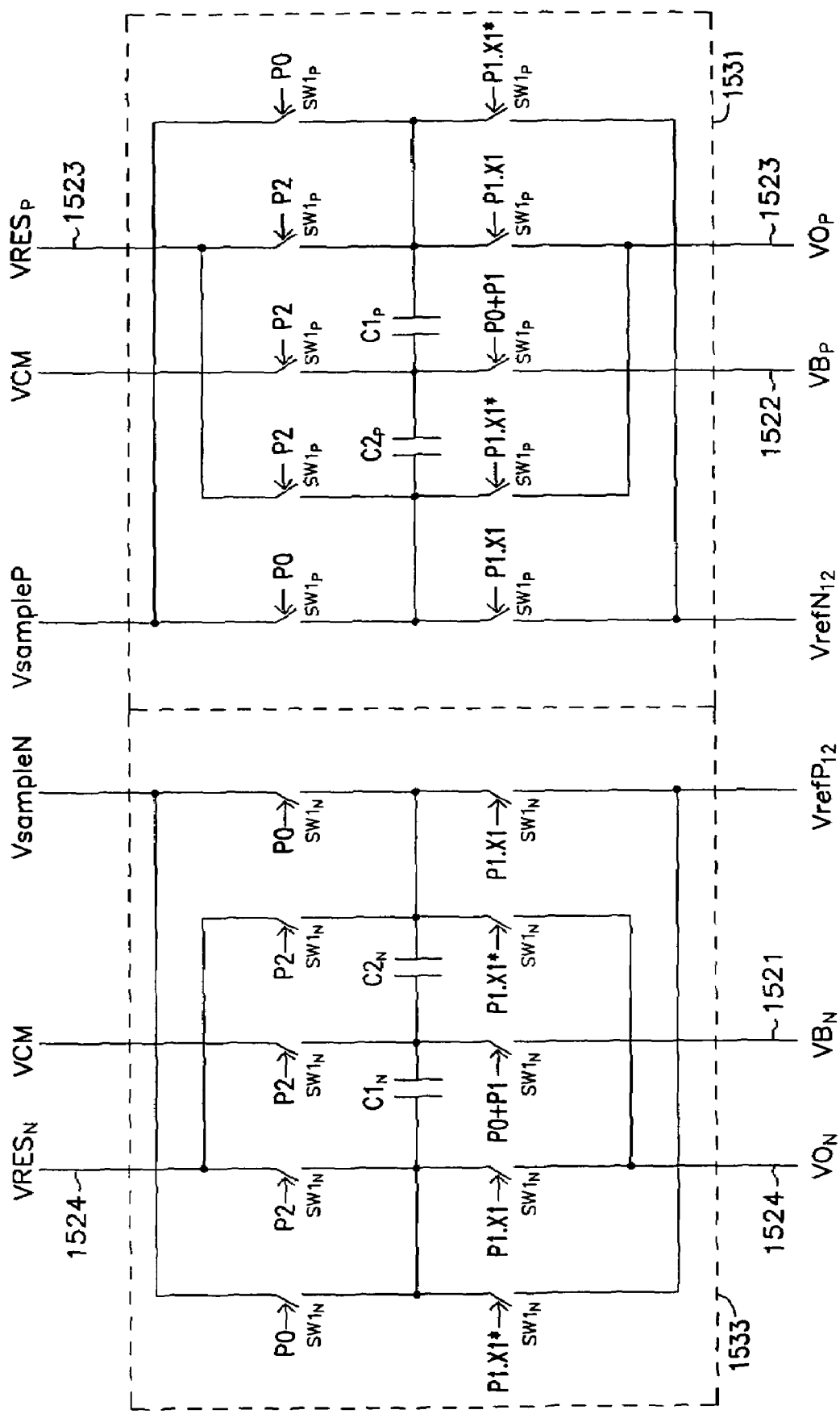
FIG. 16 shows details of some portions of the differential capacitor network portion the ADC of FIG. 15.
Figure 17:
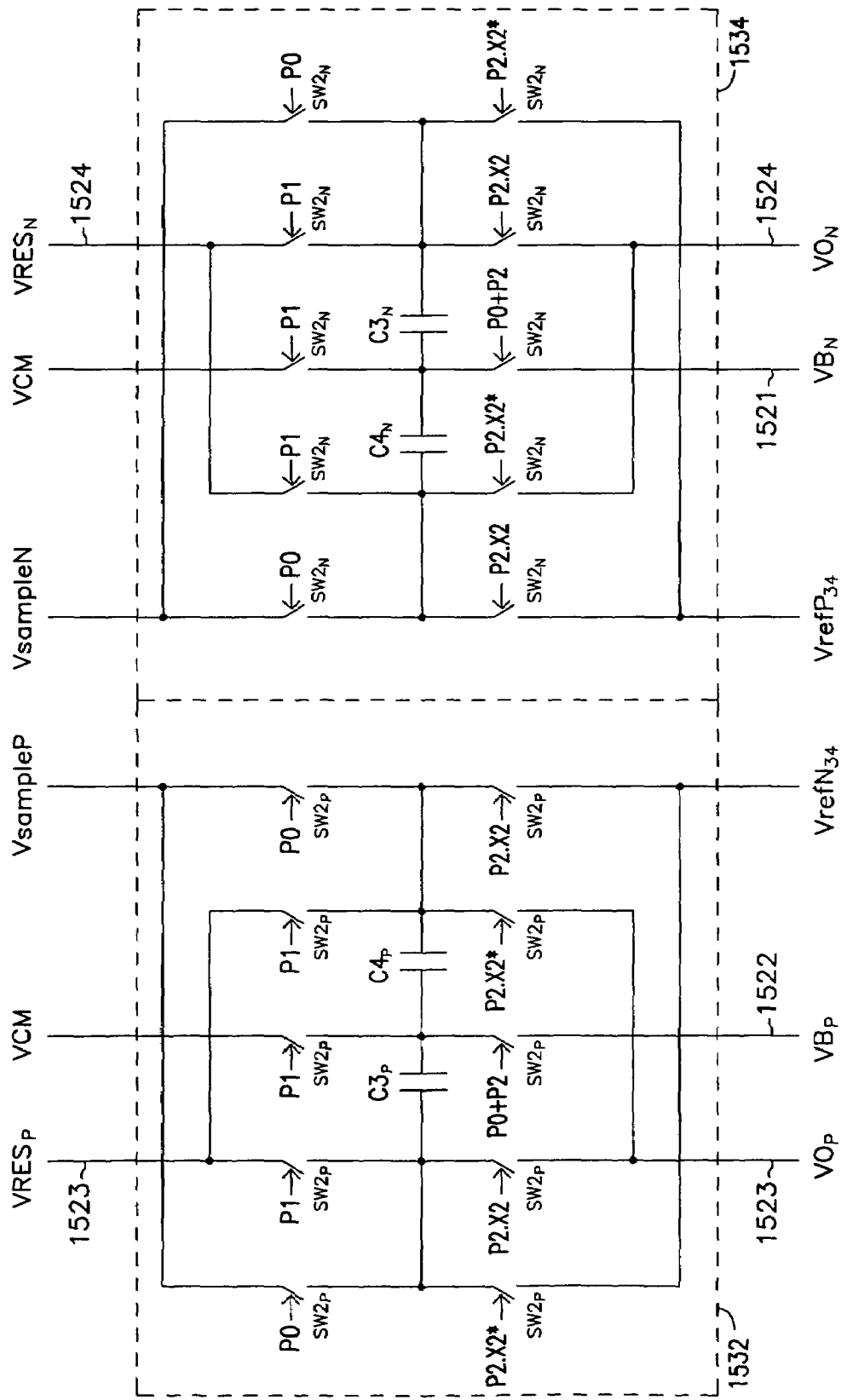
FIG. 17 shows details of other portions of the differential capacitor network portion the ADC of FIG. 15.

As shown in FIG. 15, converting unit 1510 may include a selector circuit 1515, a reset circuit 1517, an amplifier 1520, and a differential capacitor network having capacitor network portions 1531, 1532, 1533, 1534 coupled to amplifier 1520 in a symmetrical configuration. Details of capacitor network portions 1531, 1532, 1533, 1534 are shown in FIG. 16 and FIG. 17. In FIG. 15, amplifier 1520 may include amplifier input nodes 1521 and 1522, and an amplifier output nodes 1523 and 1524 to provide residue signals VresidueN$_i$ and VresidueP$_i$, respectively. ADC 1501 may include signals that are similar to or identical to those of ADC 301 of FIG. 3 and ADC 601 of FIG. 6, such as signals P0, P1, P2, X0, X0*, X1, X1*, X2, X2*, and RST. ADC 1501 may include differential signals similar to or identical to those of ADC 1401 such as the differential signal V$_{INN}$ and V$_{INP}$, the differential signal VrefP$_{12}$ and VrefN$_{12}$, and the differential signal VrefP$_{34}$ and VrefN$_{34}$. In FIG. 15, VsampleN and VsampleP may include samples of the V$_{INN}$ and V$_{INP}$ signals, respectively. As described above with reference to FIG. 14, since V$_{INN}$ and V$_{INP}$ may form first and second components of a different signal, VsampleN and VsampleP in FIG. 15 may also correspond to the first and second components of the different signal that is formed by V$_{INN}$ and V$_{INP}$. For ease of viewing the connections of components among FIG. 15, FIG. 16, and FIG. 17, FIG. 15 also shows labels such as VCM, VRES$_N$, VRES$_P$, VB$_N$, VB$_P$, VO$_N$, and VO$_P$ at various nodes coupled to amplifier 1520 and capacitor network portions 1531, 1532, 1533, and 1534.

FIG. 16 shows details of the differential capacitor network portion 1531 and 1533 of FIG. 15. As show in FIG. 16, capacitor network portion 1531 may include capacitors C1$_P$ and C2$_P$ and switches SW1$_P$. Capacitor network portion 1533 may include capacitors C1$_N$ and C2$_N$ and switches SW1$_N$. Capacitor network portion 1531 and 1533 may use signals P0, P1, P2, X0, X0*, X1, X1*, X2, and X2* during a conversion to turn on or off some of switches SW1$_N$ and SW1$_P$ to couple capacitors C1$_N$, C2$_N$, C1$_P$, and C2$_P$ to amplifier 1520 (FIG. 15) in different arrangements. Capacitor network portion 1531 and 1533 may include activities and arrangements similar to those of capacitor network portion 631 and 632, including the arrangements shown in chart 999 of FIG. 9 and chart 1099 of FIG. 10 but in differential fashions.

FIG. 17 shows details of the differential capacitor network portion 1532 and 1534 of FIG. 15. As show in FIG. 17, capacitor network portion 1532 may include capacitors C3$_P$ and C4$_P$ and switches SW2$_P$. Capacitor network portion 1534 may include capacitors C3$_N$ and C4$_N$ and switches SW2$_N$. Capacitor network portion 1532 and 1534 may use signals P0, P1, P2, X0, X0*, X1, X1*, X2, and X2* during a conversion to turn on or off some of switches SW2$_N$ and SW2$_P$ to couple capacitors C3$_N$, C4$_N$, C3$_P$, and C4$_P$ to amplifier 1520 (FIG. 15) in different arrangements similar to those of chart 999 of FIG. 9 and chart 1099 of FIG. 10. Capacitor network portion 1532 and 1534 may include activities and arrangements similar to those of capacitor network portion 631 and 632, including the arrangements shown in chart 999 of FIG. 9 and chart 1099 of FIG. 10 but in differential fashions.

One or more embodiments described herein include apparatus and methods having a first module with a capacitor network configured to receive a sample of an analog input signal and an amplifier configured to couple to the capacitor network in a plurality of arrangements to successively generate a plurality of residue signals at an amplifier output node of the amplifier without resetting the amplifier between generation of least two of the plurality of residue signals, and a second module configured to generate a digital signal based on a plurality of intermediate codes generated from the sample signal and the plurality of residue signals, the digital signal including a digital value of the sample. Other embodiments including additional apparatus and methods are described above with reference to FIG. 1 through FIG. 17.

The illustrations of apparatus 100, ADC 201, ADC 301, ADC 601, ADC 1401, ADC 1501, and their associated elements and features in FIG. 1 through FIG. 17 are intended to provide a general understanding of the structure of various embodiments and not a complete description of all the elements and features of the apparatus that might make use of the structures described herein.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those skilled in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. An apparatus comprising:
a first module including a capacitor network configured to receive a sample of an analog input signal, and an amplifier configured to couple to the capacitor network in a plurality of arrangements to successively generate a plurality of residue signals at an amplifier output node of the amplifier without resetting the amplifier between generation of least two of the plurality of residue signals, the amplifier including a first amplifier input node, a second amplifier input node, and an amplifier output node, the capacitor network including:
a first capacitor configured to couple to the first amplifier input node via a first path, to couple to the second amplifier input node via a second path, to couple to the amplifier output node via at least one of a third path and a fourth path, to couple to a selected one of a first reference node and a second reference node via a fifth path, and to couple to an input node via a sixth path; and
a second capacitor configured to couple to the first amplifier input node via the first path, to couple to the second amplifier input node via the second path, to couple to the amplifier output node via at least one of a seventh path and an eighth path, to couple to the selected one of the first reference node and the second reference node via a ninth path, and to couple to the input node via a tenth path; and
a second module configured to generate a digital signal based on a plurality of intermediate codes generated from the sample and the plurality of residue signals, the digital signal including a digital value of the sample.

2. The apparatus of claim 1, wherein the first and second capacitors form a first pair of capacitors of the capacitor network, the capacitor network includes a second pair of capacitors, and the first pair of capacitors and the second pair of capacitors are configured to selectively receive the sample.

3. An apparatus comprising:
a first module including a capacitor network configured to receive a sample of an analog input signal, and an amplifier configured to couple to the capacitor network in a plurality of arrangements to successively generate a plurality of residue signals at an amplifier output node of the amplifier without resetting the amplifier between generation of least two of the plurality of residue signals; and
a second module configured to generate a digital signal based on a plurality of intermediate codes generated from the sample and the plurality of residue signals, the digital signal including a digital value of the sample, wherein the capacitor network includes a first capacitor and a second capacitor configured to alternately form a feedback path and a reference path of first and second arrangements of the plurality of arrangements to generate a first residue signal and a second residue signal of the plurality of residue signals, the feedback path including a path between the amplifier output node and an amplifier input node of the amplifier, and the reference path including a path between the amplifier input node and a reference node.

4. The apparatus of claim 3, wherein the capacitor network includes a third capacitor and a fourth capacitor configured to alternately form the feedback path and an additional reference path of third and fourth arrangements of the plurality of arrangements to generate a third residue signal and a fourth residue signal of the plurality of residue signals, the additional reference path including a path between the amplifier input node and an additional reference node.

5. The apparatus of claim 4, wherein the third and fourth capacitors are configured to store a value of the first residue signal and a value of the second residue signal when the amplifier and capacitor network are arranged in the first and second arrangements, and wherein the first and second capacitors are configured to store a value of the third residue signal and a value of the fourth residue signal when the amplifier and capacitor network are arranged in the third and fourth arrangements.

6. The apparatus of claim 5, wherein the first module is configured to generate the first residue signal before the third residue signal, to generate the third residue signal before the second residue signal, and to generate the second residue signal before the fourth residue signal.

7. The apparatus of claim 1, wherein the first module includes:
a sub analog-to-digital unit configured to generate the plurality of intermediate codes based on the sample and the plurality of residue signals; and
a sub digital-to-analog unit configured to receive the plurality of intermediate codes and provide a signal to the first module during generation of the plurality of residue signals.

8. The apparatus of claim 1, wherein the analog input signal includes a differential signal.

9. An analog-to-digital converter comprising:
an amplifier including a first amplifier input node, a second amplifier input node, and an amplifier output node; and
a capacitor network including a first capacitor network portion and a second capacitor network portion, each of the first and second capacitor network portions including:
a first capacitor configured to couple to the first amplifier input node via a first path, to couple to the second amplifier input node via a second path, to couple to the amplifier output node via at least one of a third path and a fourth path, to couple to a selected one of a first reference node and a second reference node via a fifth path, and to couple to an input node via a sixth path; and
a second capacitor configured to couple to the first amplifier input node via the first path, to couple to the second amplifier input node via the second path, to couple to the amplifier output node via at least one of a seventh path and an eighth path, to couple to the selected one of the first reference node and the second reference node via a ninth path, and to couple to the input node via a tenth path.

10. The analog-to-digital converter of claim 9 further comprising a selector circuit configured to couple the input node of the first capacitor network portion to an additional node to receive a sample when the selector circuit is in a first mode, and to couple the input node of the second capacitor network portion to the additional node to receive the sample when the selector circuit is in a second mode.

11. The analog-to-digital converter of claim 9 further comprising a reset circuit to reset the amplifier only one time during conversion of a sample received at the input node of one of the first and second capacitor network portions.

12. The analog-to-digital converter of claim 9, wherein each of the first, second, third, fourth, fifth, sixth, seven, eighth, ninth, and tenth paths includes a switch.

13. The analog-to-digital converter of claim 9, wherein the first capacitor of the first capacitor network portion of is configured to couple to the first amplifier input node during a first duration of a period of a clock signal, and wherein the first capacitor of the second capacitor network portion of is configured to couple to the first amplifier input node during a second duration of the same period of the clock signal.

14. The analog-to-digital converter of claim 9, wherein the capacitor network further includes a third capacitor network portion and a fourth capacitor network portion, and wherein the first, second, third, and fourth capacitor network portions form a differential capacitor network.

* * * * *